(12) United States Patent
Zhang et al.

(10) Patent No.: US 12,164,737 B2
(45) Date of Patent: Dec. 10, 2024

(54) TOUCH CONTROL STRUCTURE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Shun Zhang, Beijing (CN); Ping Wen, Beijing (CN); Yuanqi Zhang, Beijing (CN); Yi Zhang, Beijing (CN); Tingliang Liu, Beijing (CN); Chang Luo, Beijing (CN); Wei Wang, Beijing (CN); Yu Wang, Beijing (CN); Yang Zeng, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days.

(21) Appl. No.: 18/360,218

(22) Filed: Jul. 27, 2023

(65) Prior Publication Data
US 2023/0367436 A1 Nov. 16, 2023

Related U.S. Application Data

(63) Continuation of application No. 17/419,684, filed as application No. PCT/CN2020/118538 on Sep. 28, 2020, now Pat. No. 11,755,159.

(51) Int. Cl.
G06F 3/044 (2006.01)
(52) U.S. Cl.
CPC .......... *G06F 3/0446* (2019.05); *G06F 3/0443* (2019.05)

(58) Field of Classification Search
None
See application file for complete search history.

(56) References Cited

U.S. PATENT DOCUMENTS 9,582,131 B2 2/2017 Elias
10,976,871 B2 4/2021 Lee et al.
(Continued)

FOREIGN PATENT DOCUMENTS

CN 1438608 A 8/2003
CN 101436112 B 12/2010
(Continued)

OTHER PUBLICATIONS

International Search Report & Written Opinion mailed Jun. 25, 2021, regarding PCT/CN2020/118538.
(Continued)

*Primary Examiner* — Duane N Taylor, Jr.
(74) *Attorney, Agent, or Firm* — Intellectual Valley Law, P.C.

(57) ABSTRACT

A touch control structure is provided. The touch control structure includes a corner row including a plurality of row mesh blocks electrically connected along a row direction; and a plurality of residual portions in a corner region, and electrically connected to the plurality of row mesh blocks. The touch control structure includes a corner column including a plurality of column mesh blocks electrically connected along a column direction; and a corner column mesh block at least partially in the corner region. The corner column mesh block includes a main portion and a plurality of protrusion portions along an edge of the main portion. The plurality of residual portions and the plurality of protrusion portions are alternately arranged along a direction substantially parallel to the edge of the main portion. The touch control structure further includes a residual connecting con-
(Continued)

ductive plate electrically connecting the plurality of residual portions together.

20 Claims, 13 Drawing Sheets

(56) References Cited

U.S. PATENT DOCUMENTS

| | | | |
|---|---|---|---|
| 11,036,342 | B2 | 6/2021 | Hwang et al. |
| 2009/0128518 | A1 | 5/2009 | Kinoshita et al. |
| 2010/0134422 | A1 | 6/2010 | Borras |
| 2013/0154996 | A1 | 6/2013 | Trend et al. |
| 2014/0168138 | A1 | 6/2014 | Kuo et al. |
| 2017/0147126 | A1 | 5/2017 | Chiu et al. |
| 2017/0185224 | A1 | 6/2017 | Nagata et al. |
| 2018/0239457 | A1 | 8/2018 | He et al. |
| 2018/0240850 | A1 | 8/2018 | Chen et al. |
| 2019/0204974 | A1 | 7/2019 | Gong |
| 2020/0064968 | A1 | 2/2020 | Kim et al. |
| 2020/0301544 | A1 | 9/2020 | Jeong et al. |
| 2021/0020701 | A1 | 1/2021 | Zheng |

FOREIGN PATENT DOCUMENTS

| | | |
|---|---|---|
| CN | 102232208 A | 11/2011 |
| CN | 103176674 A | 6/2013 |
| CN | 105426018 A | 3/2016 |
| CN | 107390963 A | 11/2017 |
| CN | 108182015 A | 6/2018 |
| CN | 108388368 A | 8/2018 |
| CN | 111668286 A | 9/2020 |
| CN | 111722744 A | 9/2020 |

OTHER PUBLICATIONS

Ex Parte Quayle Action in the U.S. Appl. No. 17/419,684, dated Apr. 3, 2023.
Response to the Ex Parte Quayle Action in the U.S. Appl. No. 17/419,684, dated May 26, 2023.
Notice of Allowance in the U.S. Appl. No. 17/419,684, dated Jun. 8, 2023.

TOUCH CONTROL STRUCTURE AND DISPLAY APPARATUS

CROSS-REFERENCE TO RELATED APPLICATION

This application is a continuation of U.S. application Ser. No. 17/419,684, filed Sep. 28, 2020, which is a national stage application under 35 U.S.C. § 371 of International Application No. PCT/CN2020/118538, filed Sep. 28, 2020. Each of the forgoing applications is herein incorporated by reference in its entirety for all purposes.

TECHNICAL FIELD

The present invention relates to display technology, more particularly, to a touch control structure and a display apparatus.

BACKGROUND

Various types of touch panels have been developed. Examples of touch panels include one-glass-solution (OGS) touch panels, on-cell touch panels, and in-cell touch panels. The on-cell touch panels provide high touch control accuracy. The on-cell touch panels can be classified into single-layer-on-cell (SLOC) touch panels and multi-layer-on-cell (MLOC) touch panels. In particular, multiple point touch control can be achieved in the MLOC touch panels with superior touch control accuracy and blanking effects.

SUMMARY

In one aspect, the present disclosure provides a touch control structure, comprising a plurality of first mesh electrodes arranged respectively in a plurality of rows and a plurality of second mesh electrodes arranged respectively in a plurality of columns; wherein a corner row of the plurality of first mesh electrodes comprises a plurality of row mesh blocks electrically connected along a row direction; and at least one residual portion in a corner region; wherein a corner column of the plurality of second mesh electrodes comprises a plurality of column mesh blocks electrically connected along a column direction; and a corner column mesh block at least partially in the corner region; wherein the at least one residual portion is electrically connected to one of a row mesh block of the plurality of row mesh blocks or the corner column mesh block; and the at least one residual portion is at least partially surrounded by, and spaced apart from, another of the row mesh block or the corner column mesh block.

Optionally, the corner column mesh block comprises a main portion and a plurality of protrusion portions along an edge of the main portion; wherein the plurality of residual portions and the plurality of protrusion portions are alternately arranged along a direction substantially parallel to the edge of the main portion; wherein the touch control structure further comprises a residual connecting conductive plate electrically connecting the plurality of residual portions together, the residual connecting conductive plate extending along a periphery of a combination of the plurality of protrusion portions and the plurality of residual portions.

Optionally, the touch control structure further comprises a protrusion connecting conductive plate electrically connecting the plurality of protrusion portions together, multiple mesh lines of a respective one of the plurality of protrusion portions directly connected to the protrusion connecting conductive plate, the protrusion connecting conductive plate extending along the periphery of the combination of the plurality of protrusion portions and the plurality of residual portions.

Optionally, the touch control structure further comprises a plurality of residual connecting bridges respectively crossing over and insulated from the protrusion connecting conductive plate.

Optionally, the touch control structure further comprises a plurality of residual conductive plates respectively connected to the plurality of residual portions, multiple mesh lines of a respective one of the plurality of residual portions directly connected to a respective one of the plurality of residual conductive plates; wherein a respective one of the plurality of residual connecting bridges connects a respective one of the plurality of residual conductive plates to the residual connecting conductive plate; and in a region between the respective one of the plurality of residual conductive plates and the residual connecting conductive plate, a portion of the protrusion connecting conductive plate is between the respective one of the plurality of residual conductive plates and the residual connecting conductive plate.

Optionally, the plurality of row mesh blocks comprises an adjacent mesh block; the touch control structure further comprises an adjacent conductive plate, multiple mesh lines of the adjacent mesh block directly connected to the adjacent conductive plate; wherein the residual connecting conductive plate is connected to the adjacent conductive plate.

Optionally, the touch control structure further comprises a first touch signal line, a portion of which on a side of the adjacent conductive plate away from the adjacent mesh block, the first touch signal line extending along a periphery of a combination of the adjacent conductive plate and the adjacent mesh block; wherein the protrusion connecting conductive plate is connected to the first touch signal line.

Optionally, in a first crossing-over region, the residual connecting conductive plate is connected to the adjacent conductive plate, and the protrusion connecting conductive plate is connected to the first touch signal line; the touch control structure further comprises a first connecting portion and a second connecting portion respectively in the first crossing-over region, and a touch insulating layer between the first connecting portion and the second connecting portion; the first connecting portion connects the residual connecting conductive plate and the adjacent conductive plate together; and the second connecting portion connects the protrusion connecting conductive plate and the first touch signal line together.

Optionally, each of the residual connecting conductive plate, the adjacent conductive plate, at least a portion of the protrusion connecting conductive plate outside of crossing-over regions, and the first touch signal line, comprises a double-layer structure; and the double-layer structure comprises a first sub-layer in a same layer as the first connecting portion and a second sub-layer in a same layer as the second connecting portion.

Optionally, the touch control structure further comprises a first interference preventing plate, the first interference preventing plate comprising a first sub-plate, a second sub-plate, and a third connecting portion connecting the first sub-plate and the second sub-plate, the third connecting portion in the first crossing-over region and insulated from the first connecting portion by the touch insulating layer; wherein the first sub-plate is between a portion of the residual connecting conductive plate and a portion of the protrusion connecting conductive plate; and the second sub-plate is on a side of the first touch signal line away from the adjacent conductive plate.

Optionally, the first interference preventing plate is configured to be provided with a square wave scanning signal; wherein the square wave scanning signal is same as a touch scanning signal provided to touch scanning electrodes of the touch control structure.

Optionally, each of the residual connecting conductive plate, the adjacent conductive plate, at least a portion of the protrusion connecting conductive plate outside of crossing-over regions, the first touch signal line, the first sub-plate, and the second sub-plate, comprises a double-layer structure; and the double-layer structure comprises a first sub-layer in a same layer as the first connecting portion and a second sub-layer in a same layer as the second connecting portion.

Optionally, the touch control structure further comprises vias extending through the touch insulating layer, the second sub-layer electrically connected to the first sub-layer through a respective via extending through the touch insulating layer.

Optionally, in a second crossing-over region, the residual connecting conductive plate is connected to a respective one of the plurality of residual conductive plates through the respective one of the plurality of residual connecting bridge; and the touch control structure further comprises a first interference preventing plate, the first interference preventing plate comprising a third sub-plate, a fourth sub-plate, and a fourth connecting portion connecting the third sub-plate and the fourth sub-plate, the fourth connecting portion in the second crossing-over region and insulated from the respective one of the plurality of residual connecting bridges by the touch insulating layer; the third sub-plate and the fourth sub-plate are between a portion of the residual connecting conductive plate and a portion of the protrusion connecting conductive plate.

Optionally, the protrusion connecting conductive plate comprises a fifth sub-plate, a sixth sub-plate, and a fifth connecting portion connecting the fifth sub-plate and the sixth sub-plate, the fifth connecting portion in the second crossing-over region and insulated from the respective one of the plurality of residual connecting bridges by the touch insulating layer, the fifth connecting portion and the fourth connecting portion in a same layer.

Optionally, each of the residual connecting conductive plate, the respective one of the plurality of residual conductive plates, the third sub-plate, the fourth sub-plate, the fifth sub-plate, and the sixth sub-plate, comprises a double-layer structure; and the double-layer structure comprises a first sub-layer in a same layer as the fifth connecting portion and the fourth connecting portion, and a second sub-layer in a same layer as the respective one of the plurality of residual connecting bridge.

Optionally, in a third crossing-over region, the residual connecting conductive plate is connected to the respective one of the plurality of residual conductive plates through a second respective one of the plurality of residual connecting bridge; the first interference preventing plate further comprises a seventh sub-plate, and a sixth connecting portion connecting the third sub-plate and the seventh sub-plate, the sixth connecting portion in the third crossing-over region and insulated from the second respective one of the plurality of residual connecting bridges by the touch insulating layer; and the protrusion connecting conductive plate further comprises an eighth sub-plate and a seventh connecting portion connecting the fifth sub-plate and the eighth sub-plate, the seventh connecting portion in the third crossing-over region and insulated from the second respective one of the plurality of residual connecting bridges by the touch insulating layer, the fourth connecting portion, the fifth connecting portion, the sixth connecting portion, and the seventh connecting portion in a same layer.

Optionally, the first interference preventing plate further comprises an inner sub-plate between a respective one of the plurality of residual portions and the fifth sub-plate; a first inner connecting bridge, and a second inner connecting bridge, the first inner connecting bridge and the second inner connecting bridge respectively connecting the inner sub-plate to the third sub-plate; the inner sub-plate, the third sub-plate, the first inner connecting bridge, and the second inner connecting bridge, form a first ring structure; an orthographic projection of the first ring structure on the touch insulating layer surround an orthographic projection of the fifth sub-plate; and the first inner connecting bridge, the second inner connecting bridge, the respective one of the plurality of residual connecting bridges, the second respective one of the plurality of residual connecting bridges, are in a same layer.

Optionally, the respective one of the plurality of residual conductive plates, the respective one of the plurality of residual connecting bridges, the second respective one of the plurality of residual connecting bridges, and a portion of the residual connecting conductive plate form a second ring structure; and an orthographic projection of the second ring structure on the touch insulating layer surround an orthographic projection of the first ring structure on the touch insulating layer.

Optionally, each of the residual connecting conductive plate, the respective one of the plurality of residual conductive plates, the inner sub-plate, the third sub-plate, the fourth sub-plate, the fifth sub-plate, the sixth sub-plate, the seventh sub-plate, and the eighth sub-plate, comprises a double-layer structure; and the double-layer structure comprises a first sub-layer in a same layer as the fifth connecting portion and the fourth connecting portion, and a second sub-layer in a same layer as the respective one of the plurality of residual connecting bridge.

Optionally, the touch control structure further comprises a plurality of residual conductive plates respectively connected to the plurality of residual portions, multiple mesh lines of a respective one of the plurality of residual portions directly connected to a respective one of the plurality of residual conductive plates; and a plurality of residual connecting bridges respectively crossing over and insulated from the protrusion connecting conductive plate, a respective one of the plurality of residual connecting bridge connects a respective one of the plurality of residual conductive plates to the residual connecting conductive plate; the plurality of residual portions comprises a last residual portion; the plurality of residual conductive plates comprises a last residual conductive plate; the plurality of residual connecting bridges comprises a first last residual connecting bridge and a second last residual connecting bridge respectively connecting the last residual portion to the last residual conductive plate; a portion of the residual connecting conductive plate, the last residual conductive plate, the first last residual connecting bridge, the second last residual connecting bridge form a third ring structure; and orthographic projections of the protrusion connecting conductive plate and interference preventing plates on a touch insulating layer are absent inside an orthographic projection of the third ring structure on the touch insulating layer.

Optionally, the touch control structure further comprises a second interference preventing plate extending along a periphery of the residual connecting conductive plate, the residual connecting conductive plate between the second interference preventing plate and the protrusion connecting conductive plate.

In another aspect, the present disclosure provides a display apparatus, comprising the touch control structure described herein or fabricated by a method described herein, a display panel, and an integrated circuit connected to the display panel.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
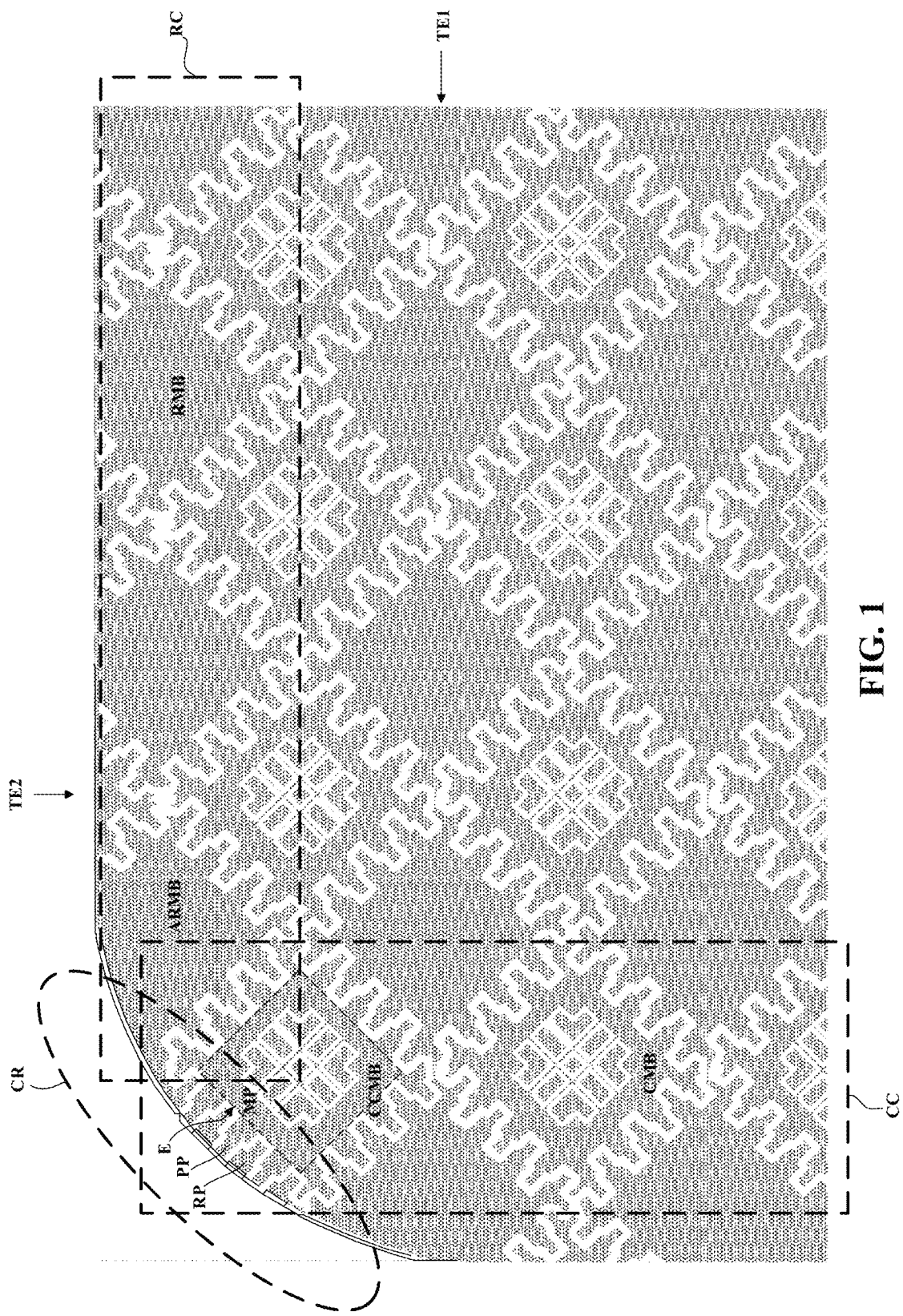
FIG. 1 is a partial view of a touch control structure in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a touch substrate and a display apparatus that substantially obviate one or more of the problems due to limitations and disadvantages of the related art. In one aspect, the present disclosure provides a touch control structure. In some embodiments, the touch control structure includes a plurality of first mesh electrodes arranged respectively in a plurality of rows and a plurality of second mesh electrodes arranged respectively in a plurality of columns. In some embodiments, a corner row of the plurality of first mesh electrodes includes a plurality of row mesh blocks electrically connected along a row direction; and a plurality of residual portions in a corner region, and electrically connected to the plurality of row mesh blocks. In some embodiments, a corner column of the plurality of second mesh electrodes includes a plurality of column mesh blocks electrically connected along a column direction; and a corner column mesh block at least partially in the corner region. Optionally, the corner column mesh block includes a main portion and a plurality of protrusion portions along an edge of the main portion. Optionally, the plurality of residual portions and the plurality of protrusion portions are alternately arranged along a direction substantially parallel to the edge of the main portion. Optionally, the touch control structure further includes a residual connecting conductive plate electrically connecting the plurality of residual portions together, the residual connecting conductive plate extending along a periphery of a combination of the plurality of protrusion portions and the plurality of residual portions.

Flexible multi-layer on-cell touch (FMLOC) technology is utilized to form mesh electrode pattern on top of an encapsulating layer of a display panel. The mesh electrode pattern includes touch scanning electrodes and touch sensing electrodes, and optionally fill patterns ("dummy patterns"). A touch detection integrated circuit is configured to detect a touch by sensing a mutual capacitance between a touch scanning electrode and a touch sensing electrode, and a change of the mutual capacitance upon a touch. In a corner region of a touch control structure, touch electrodes are truncated as compared to an internal touch electrode, resulting in a relatively smaller mutual capacitance. As a result, a value of the change of mutual capacitance detected in the corner region is relatively smaller than that detected in an internal region of the touch control structure, leading to a lowered touch detection sensitivity in the corner region.

The inventors of the present disclosure discover that, unexpectedly and surprisingly, the lowered touch detection sensitivity in the corner region can be significantly improved by having an intricate touch control structure including a protrusion connecting conductive plate and a residual connecting conductive plate as disclosed herein. In the present touch control structure, the mutual capacitance can be compensated while at the same time scanning/sensing signal interference can be reduced, resulting in significantly improved touch control performance, particularly in the corner region.

Mesh electrodes include mesh lines which typically have a line width in a range of 1 μm to 50 μm. Thus, connecting adjacent mesh blocks through the mesh lines is particularly difficult, and often resulting in poor connectivity. The present disclosure adopts a novel and advantageous touch electrode design that obviate issues in related touch control structures.

FIG. 1 is a partial view of a touch control structure in some embodiments according to the present disclosure. Referring to FIG. 1, the touch control structure in some embodiments includes a plurality of first mesh electrodes TE1 arranged respectively in a plurality of rows and a plurality of second mesh electrodes TE2 arranged in respectively a plurality of columns. Optionally, the touch control structure is a mutual capacitance type touch control structure. Optionally, the plurality of first mesh electrodes TE1 are a plurality of touch scanning electrodes, and the plurality of second mesh electrodes TE2 are a plurality of touch sensing electrodes. Optionally, the plurality of mesh touch electrodes TE1 are a plurality of touch sensing electrodes, and the plurality of second mesh electrodes TE2 are a plurality of touch scanning electrodes. Optionally, the touch control structure is in a touch control region of a display panel. Optionally, the touch control region substantially overlaps with a display region of the display panel. The display panel is configured to display an image in at least a portion of the touch control region.

Referring to FIG. 1, in some embodiments, at least one row of the plurality of rows of first mesh electrodes is a corner row RC, and at least one column of the plurality of columns of second mesh electrodes is a corner column CC. As used herein, a corner row RC refers to a row of the plurality of first mesh electrodes TE1 that includes a plurality of row mesh blocks RMB electrically connected along a row direction; and a plurality of residual portions RP in a corner region CR, and electrically connected to the plurality of row mesh blocks RMB. As used herein, a corner column CC refers to a column of the plurality of second mesh electrodes TE2 that includes a plurality of column mesh blocks CMB electrically connected along a column direction; and a corner column mesh block CCMB at least partially in the corner region CR. As used herein, a corner region CR refers to a region where two edges of the touch control structure meet each other. The corner region CR itself may have an edge that is non-parallel to either of the two edges of the touch control structure. The corner region CR optionally may be various appropriate contour shapes. In one example, the corner region CR has an arch-shaped contour. In another example, the corner region CR has a radiused edge along the arch-shaped contour. In another example, the corner region CR has a straight line contour, and a straight-line edge is non-parallel to either of the two edges of the touch control structure. In another example, the corner region CR has an irregular contour shape.

Referring to FIG. 1, the corner column mesh block CCMB in some embodiments includes a main portion MP (encircled by a diamond-shaped dotted line area) and a plurality of protrusion portions PP ("fingers") along an edge E of the main portion MP. Optionally, the plurality of residual portions RP and the plurality of protrusion portions PP are alternately arranged along a direction substantially parallel to the edge E of the main portion MP. In one example, the plurality of residual portions RP and the plurality of protrusion portions PP are arranged in an RP PP RP PP RP PP pattern, including three residual portions and three protrusion portions alternately arranged along the direction substantially parallel to the edge E of the main portion MP.

Figure 2:
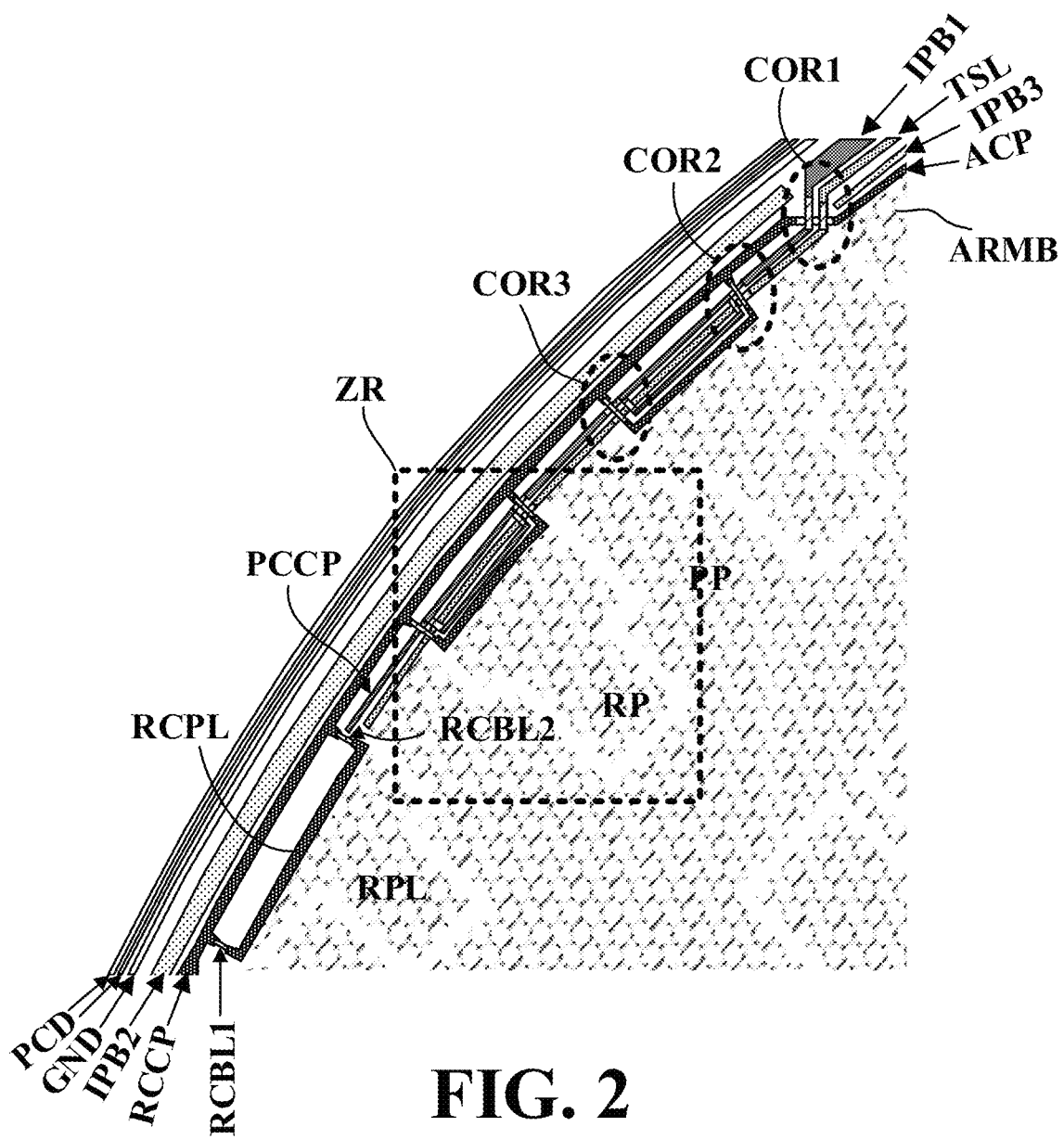
FIG. 2 is a zoom-in partial view in a corner region of a touch control structure in some embodiments according to the present disclosure.

FIG. 2 is a zoom-in partial view in a corner region of a touch control structure in some embodiments according to the present disclosure. Referring to FIG. 1 and FIG. 2, the touch control structure in some embodiments further includes a protrusion connecting conductive plate PCCP electrically connecting the plurality of protrusion portions PP together, and a residual connecting conductive plate RCCP electrically connecting the plurality of residual portions RP together. Optionally, multiple mesh lines of a respective one of the plurality of protrusion portions PP directly connected to the protrusion connecting conductive plate PCCP. The protrusion connecting conductive plate PCCP extends along a periphery of a combination of the plurality of protrusion portions PP and the plurality of residual portions RP. The residual connecting conductive plate RCCP extends along the periphery of the combination of the plurality of protrusion portions PP and the plurality of residual portions RP.

Figure 3:
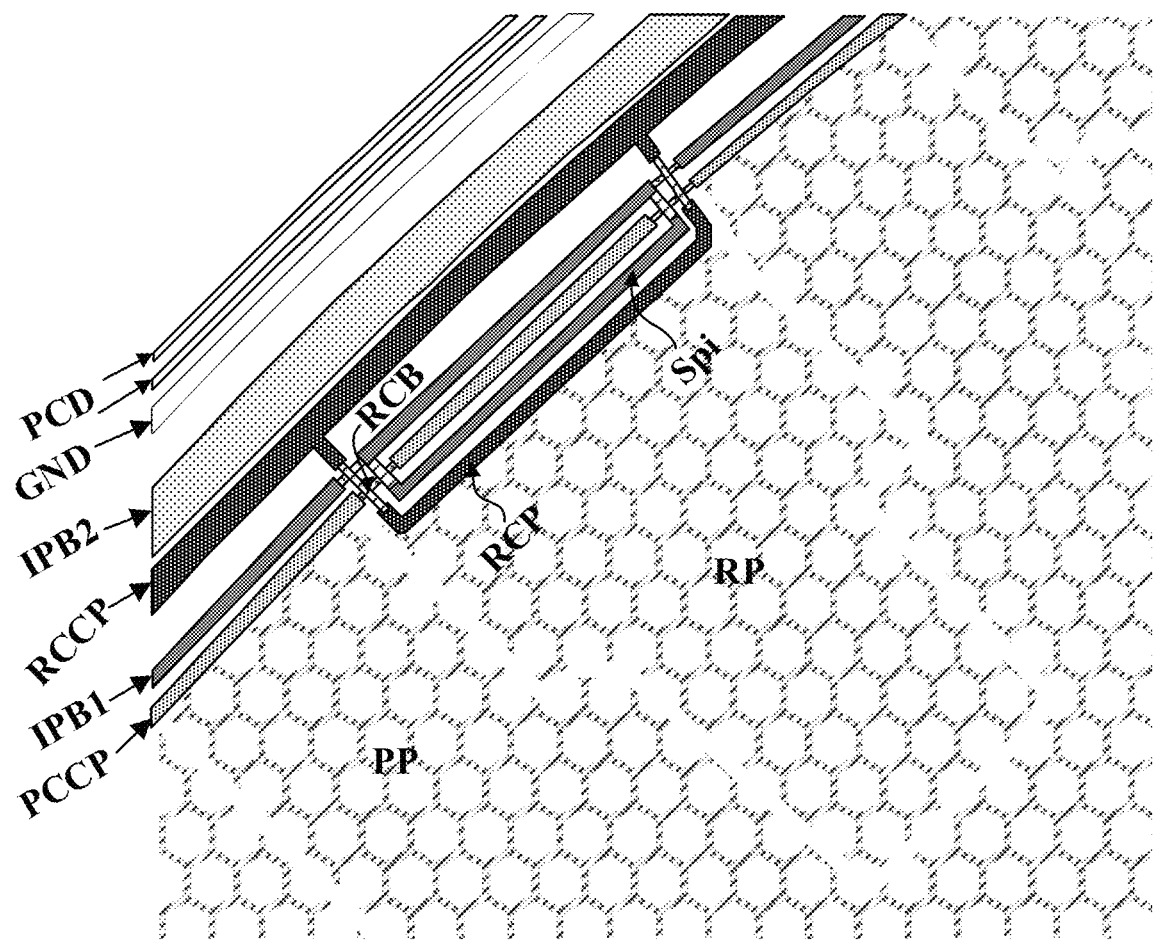
FIG. 3 is a zoom-in view of a zoom-in region ZR in FIG. 2.

FIG. 3 is a zoom-in view of a zoom-in region ZR in FIG. 2. Referring to FIG. 3, the touch control structure in some embodiments further includes a plurality of residual conductive plates RCP respectively connected to the plurality of residual portions RP. Multiple mesh lines of a respective one of the plurality of residual portions RP are directly connected to a respective one of the plurality of residual conductive plates RCP. In some embodiments, a plurality of residual connecting bridges RCB respectively cross over the protrusion connecting conductive plate PCCP. The plurality of residual connecting bridges RCB are insulated from the protrusion connecting conductive plate PCCP, e.g., by a touch insulating layer. Optionally, a respective one of the plurality of residual connecting bridges RCB connects a respective one of the plurality of residual conductive plates RCP to the residual connecting conductive plate RCCP. Optionally, in a region between the respective one of the plurality of residual conductive plates RCP and the residual connecting conductive plate RCCP, a portion of the protrusion connecting conductive plate PCCP is between the respective one of the plurality of residual conductive plates RCP and the residual connecting conductive plate RCCP.

Referring to FIG. 1 and FIG. 2, the plurality of row mesh blocks RMB in the corner row RC include an adjacent mesh block ARMB. Optionally, the adjacent mesh block ARMB is at least partially in the corner region CR. Optionally, the adjacent mesh block ARMB is outside the corner region CR. The adjacent mesh block ARMB is adjacent to the plurality of residual portions RP.

Figure 4A:
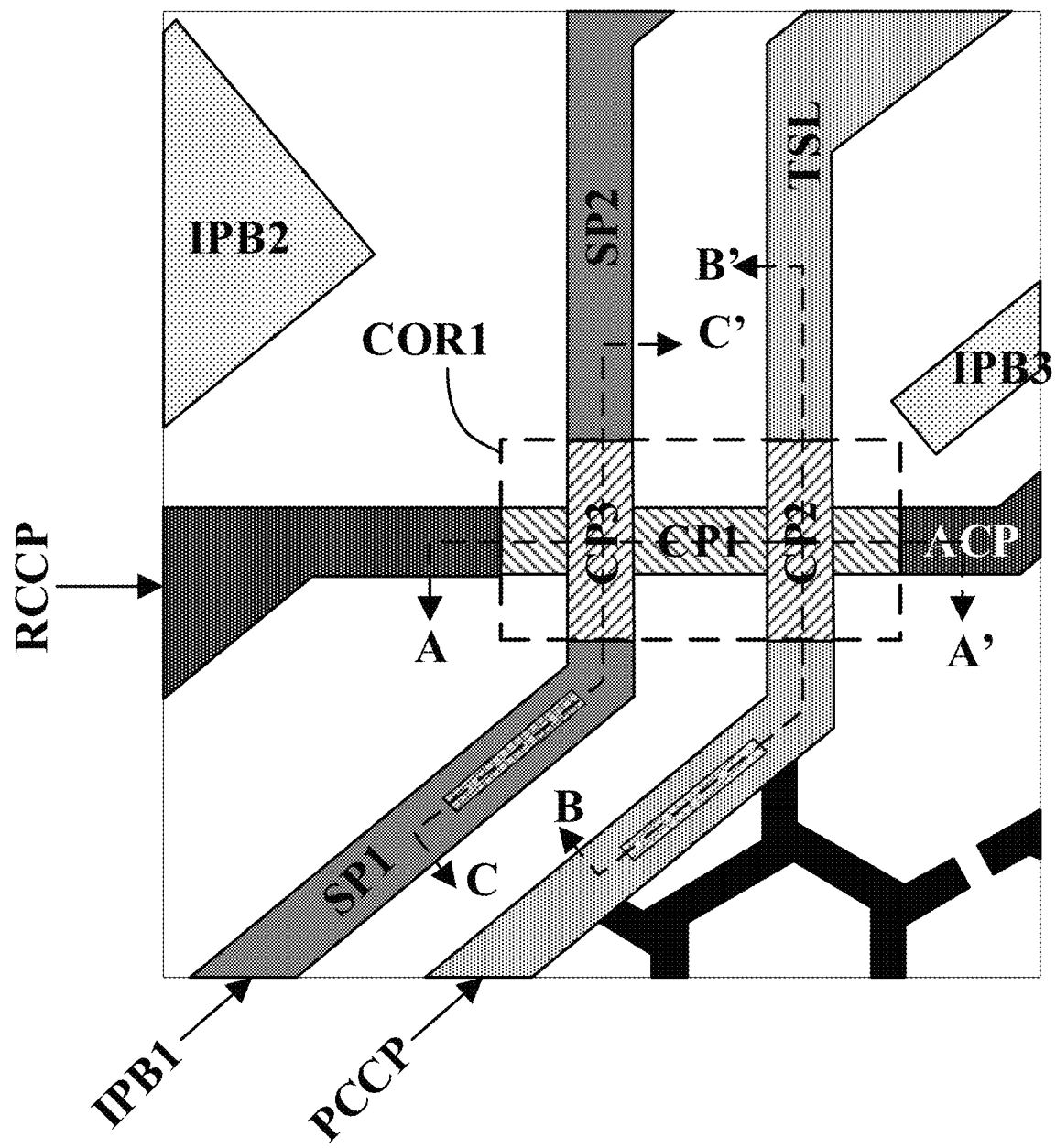
FIG. 4A is a zoom-in view of a first crossing-over region in FIG. 2.

FIG. 4A is a zoom-in view of a first crossing-over region in FIG. 2. Referring to FIG. 1, FIG. 2, and FIG. 4A, the touch control structure in some embodiments further includes an adjacent conductive plate ACP. Optionally, multiple mesh lines of the adjacent mesh block ARMB are directly connected to the adjacent conductive plate ACP. Optionally, the residual connecting conductive plate RCCP is also connected to the adjacent conductive plate ACP.

In some embodiments, the touch control structure further includes a plurality of first touch signal lines respectively connected to the plurality of first mesh electrodes TE1, and a plurality of second touch signal lines respectively connected to the plurality of second mesh electrodes TE2. Referring to FIG. 1, FIG. 2, and FIG. 4A, the touch control structure in some embodiments further includes a first touch signal line TSL (one of the plurality of first touch signal lines). Optionally, a portion of the first touch signal line TSL is on a side of the adjacent conductive plate ACP away from the adjacent mesh block ARMB. Optionally, the first touch signal line TSL extends along a periphery of a combination of the adjacent conductive plate ACP and the adjacent mesh block ARMB. Optionally, the protrusion connecting conductive plate PCCP is connected to the first touch signal line TSL.

Figure 4B:
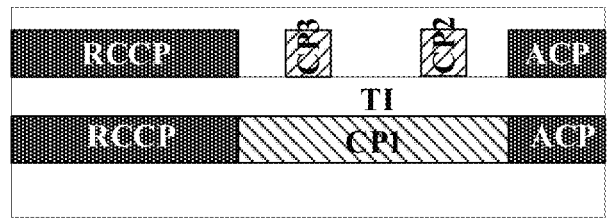
FIG. 4B shows a cross-sectional view along an A-A' line in FIG. 4A.
Figure 4C:
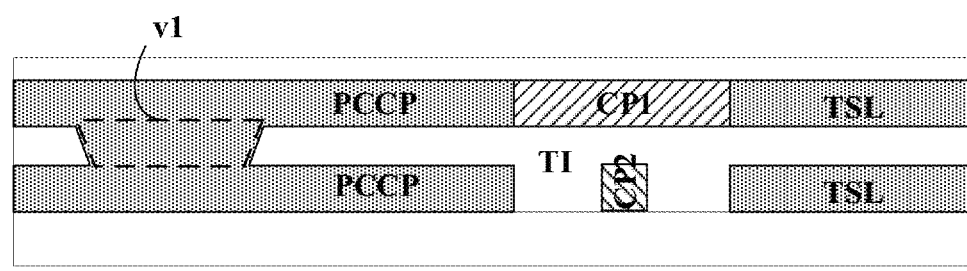
FIG. 4C shows a cross-sectional view along a B-B' line in FIG. 4A.
Figure 4D:
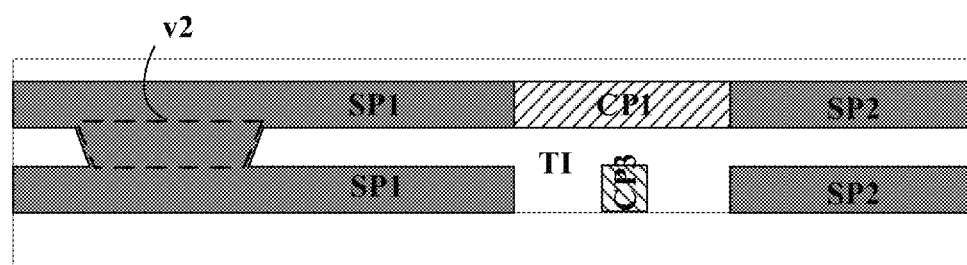
FIG. 4D shows a cross-sectional view along a C-C' line in FIG. 4A.

In some embodiments, and referring to FIG. 1, FIG. 2, and FIG. 4A, in the first crossing-over region COR1, the residual connecting conductive plate RCCP is connected to the adjacent conductive plate ACP, and the protrusion connecting conductive plate PCCP is connected to the first touch signal line TSL. FIG. 4B shows a cross-sectional view along an A-A' line in FIG. 4A. FIG. 4C shows a cross-sectional view along a B-B' line in FIG. 4A. FIG. 4D shows a cross-sectional view along a C-C' line in FIG. 4A. As shown in FIG. 4A to FIG. 4D, in some embodiments, the touch control structure further includes a first connecting portion CP1 and a second connecting portion CP2 respectively in the first crossing-over region COR1; and a touch insulating layer TI between the first connecting portion CP1 and the second connecting portion CP2. The first connecting portion CP1 connects the residual connecting conductive plate RCCP and the adjacent conductive plate ACP together. The second connecting portion CP2 connects the protrusion connecting conductive plate PCCP and the first touch signal line TSL together.

In some embodiments, each of the residual connecting conductive plate RCCP, the adjacent conductive plate ACP, at least a portion of the protrusion connecting conductive plate PCCP outside of crossing-over regions, and the first touch signal line TSL, includes a double-layer structure. Optionally, the double-layer structure includes a first sub-layer in a same layer as the first connecting portion CP1 and a second sub-layer in a same layer as the second connecting portion CP2. Optionally, the touch control structure further includes vias extending through the touch insulating layer TI, the second sub-layer electrically connected to the first sub-layer through a respective via extending through the touch insulating layer TI.

As used herein, the term "same layer" refers to the relationship between the layers simultaneously formed in the same step. In one example, the first sub-layer and the first connecting portion CP1 are in a same layer when they are formed as a result of one or more steps of a same patterning process performed in a material deposited in a same deposition process. In another example, the first sub-layer and the first connecting portion CP1 can be formed in a same layer by simultaneously performing the step of forming the first sub-layer and the step of forming the first connecting portion CP1. The term "same layer" does not always mean that the thickness of the layer or the height of the layer in a cross-sectional view is the same.

Referring to FIG. 4C, at least a portion of the protrusion connecting conductive plate PCCP outside of crossing-over regions (e.g., outside the first crossing-over region COR1) includes a double-layer structure, which includes a first sub-layer in a same layer as the first connecting portion CP1 and a second sub-layer in a same layer as the second connecting portion CP2. The second sub-layer is electrically connected to the first sub-layer through a first via v1 extending through the touch insulating layer TI.

Referring to FIG. 1, FIG. 2, FIG. 3, and FIG. 4A to FIG. 4D, the touch control structure in some embodiments further includes a first interference preventing plate IPB1. Optionally, the first interference preventing plate IPB1 extends along a periphery of a combination of the plurality of protrusion portions PP and the plurality of residual portions RP. Optionally, at least a portion of the first interference preventing plate IPB1 is on a side of the protrusion connecting conductive plate PCCP away from the plurality of protrusion portions PP. Optionally, at least a portion of the first interference preventing plate IPB1 is on a side of the plurality of residual conductive plates RCP away from the plurality of residual portions RP. Optionally, at least a portion of the first interference preventing plate IPB1 is between the residual connecting conductive plate RCCP and each of the plurality of residual conductive plates RCP.

Referring to FIG. 4A to FIG. 4D, the first interference preventing plate IPB1 in some embodiments includes a first sub-plate SP1, a second sub-plate SP2, and a third connecting portion CP3 connecting the first sub-plate SP1 and the second sub-plate SP2. Optionally, the third connecting portion CP3 is in the first crossing-over region COR1. The third connecting portion CP3 is insulated from the first connecting portion CP1 by the touch insulating layer TI. Optionally, the first sub-plate SP1 is between a portion of the residual connecting conductive plate RCCP and a portion of the protrusion connecting conductive plate PCCP. Optionally, the second sub-plate SP2 is on a side of the first touch signal line TSL away from the adjacent conductive plate ACP.

The first interference preventing plate IPB1 is configured to prevent or reduce the interference between the plurality of first mesh electrodes TE1 and the plurality of second mesh electrodes TE2 in the corner region. For example, the first interference preventing plate IPB1 is configured to prevent or reduce the interference between the residual connecting conductive plate RCCP and the protrusion connecting conductive plate PCCP. By having a first interference preventing plate IPB1 between the residual connecting conductive plate RCCP and the protrusion connecting conductive plate PCCP, interference between touch scanning signals (e.g., Tx signals) and touch sensing signals (e.g., Rx signals) can be significantly reduced. Optionally, the first interference preventing plate IPB1 is configured to be provided with a square wave scanning signal (e.g., similar to or same as a touch scanning signal provided to touch scanning electrodes of the touch control structure). Optionally, the first interference preventing plate IPB1 is configured to be provided with a constant voltage signal.

In some embodiments, each of the residual connecting conductive plate RCCP, the adjacent conductive plate ACP, at least a portion of the protrusion connecting conductive plate PCCP outside of crossing-over regions, the first touch signal line TSL, the first sub-plate SP1, and the second sub-plate SP2, includes a double-layer structure. Optionally, the double-layer structure includes a first sub-layer in a same layer as the first connecting portion and a second sub-layer in a same layer as the second connecting portion. Optionally, the touch control structure further includes vias extending through the touch insulating layer TI, the second sub-layer electrically connected to the first sub-layer through a respective via extending through the touch insulating layer TI.

Referring to FIG. 4D, the first sub-portion SP1 includes a double-layer structure, which includes a first sub-layer in a same layer as the first connecting portion CP1 and a second sub-layer in a same layer as the second connecting portion CP2. The second sub-layer is electrically connected to the first sub-layer through a second via v2 extending through the touch insulating layer TI.

Figure 5A:
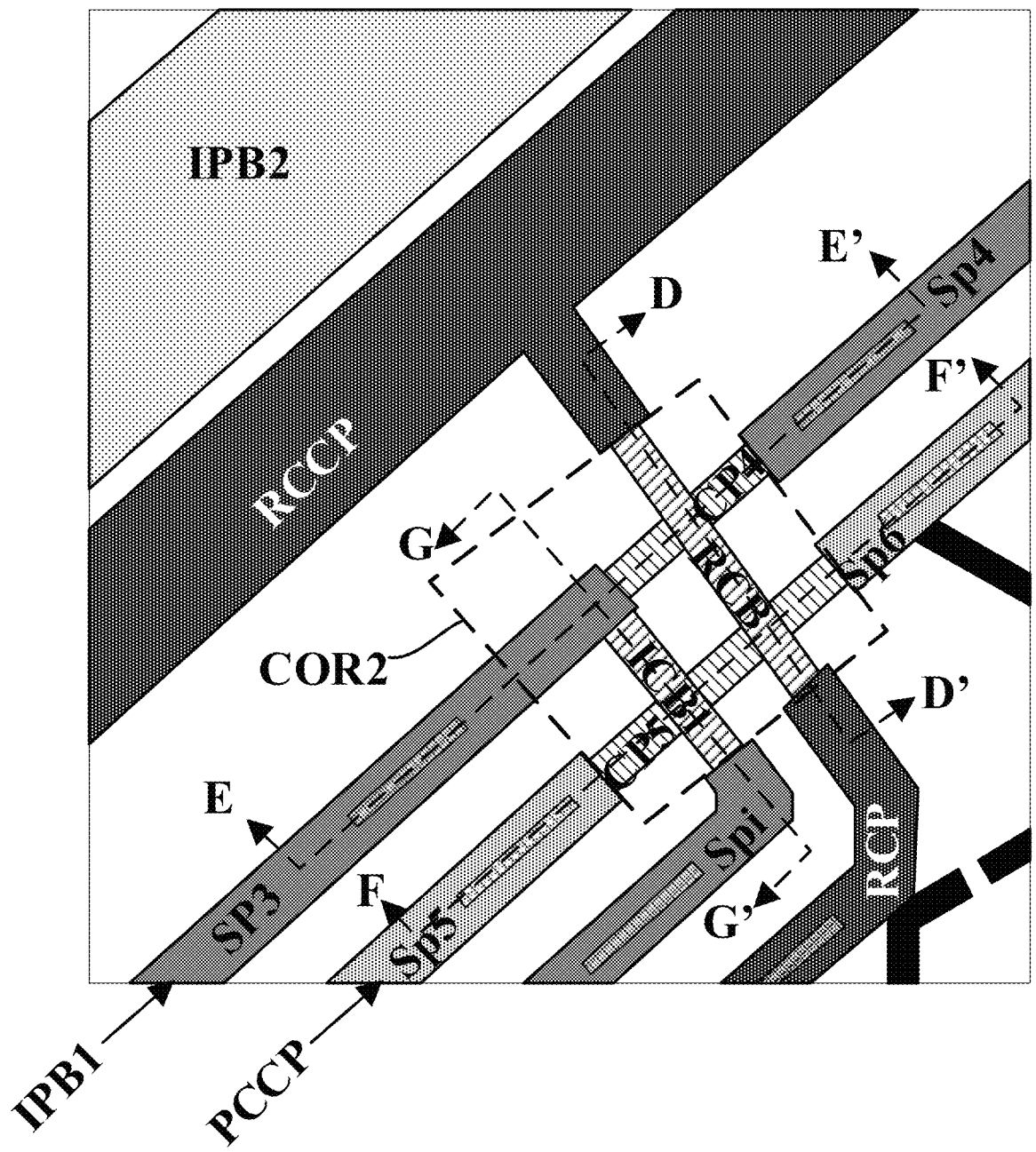
FIG. 5A is a zoom-in view of a second crossing-over region in FIG. 2.
Figure 5B:
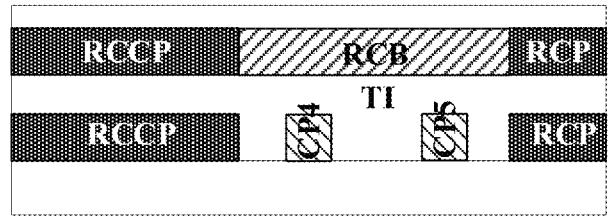
FIG. 5B shows a cross-sectional view along a D-D' line in FIG. 5A.
Figure 5C:
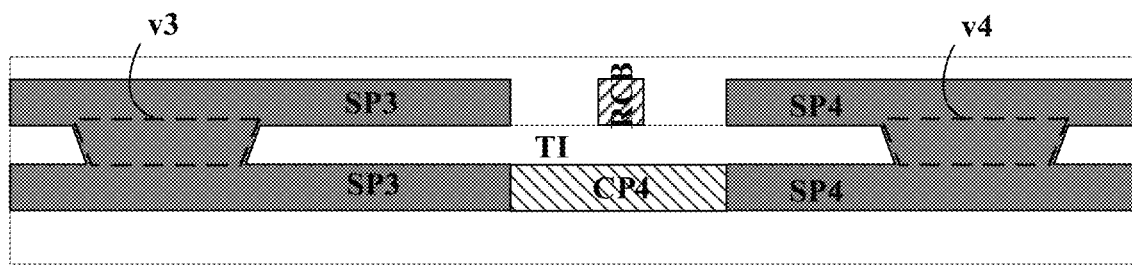
FIG. 5C shows a cross-sectional view along an E-E' line in FIG. 5A.
Figure 5D:
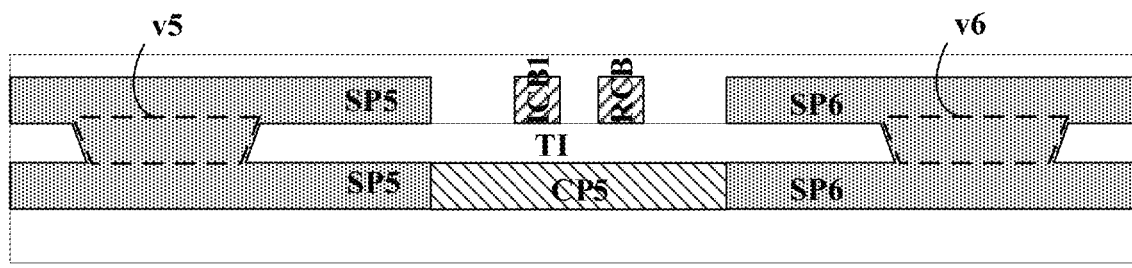
FIG. 5D shows a cross-sectional view along an F-F' line in FIG. 5A.
Figure 5E:
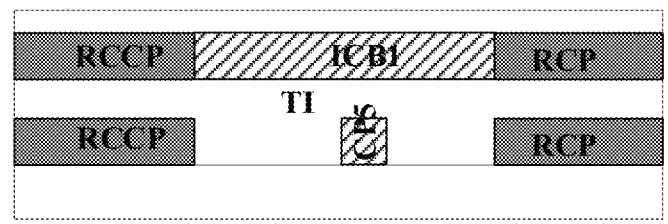
FIG. 5E shows a cross-sectional view along a G-G' line in FIG. 5A.

FIG. 5A is a zoom-in view of a second crossing-over region in FIG. 2. FIG. 5B shows a cross-sectional view along a D-D' line in FIG. 5A. FIG. 5C shows a cross-sectional view along an E-E' line in FIG. 5A. FIG. 5D shows a cross-sectional view along an F-F' line in FIG. 5A. FIG. 5E shows a cross-sectional view along a G-G' line in FIG. 5A. Referring to FIG. 1, FIG. 2, FIG. 3, and FIG. 5A to FIG. 5E, in a second crossing-over region COR2, the residual connecting conductive plate RCCP is connected to the respective one of the plurality of residual conductive plates RCP through the respective one of the plurality of residual connecting bridge RCB.

In some embodiments, the first interference preventing plate IPB1 includes a third sub-plate SP3, a fourth sub-plate SP4, and a fourth connecting portion CP4 connecting the third sub-plate SP3 and the fourth sub-plate SP4. Optionally, the fourth connecting portion CP4 is in the second crossing-over region COR2. Optionally, the fourth connecting portion CP4 is insulated from the respective one of the plurality of residual connecting bridges RCB by the touch insulating layer TI. Optionally, the third sub-plate SP3 and the fourth sub-plate SP4 are between a portion of the residual connecting conductive plate RCCP and a portion of the protrusion connecting conductive plate PCCP.

In some embodiments, the protrusion connecting conductive plate PCCP includes a fifth sub-plate SP5, a sixth sub-plate SP6, and a fifth connecting portion CP5 connecting the fifth sub-plate SP5 and the sixth sub-plate SP6. Optionally, the fifth connecting portion CP5 is in the second crossing-over region COR2. Optionally, the fifth connecting portion CP5 is insulated from the respective one of the plurality of residual connecting bridges RCB by the touch insulating layer TI. Optionally, the fifth connecting portion CP5 and the fourth connecting portion CP4 are in a same layer.

In some embodiments, each of the residual connecting conductive plate RCCP, the respective one of the plurality of residual conductive plates RCP, the third sub-plate SP3, the fourth sub-plate SP4, the fifth sub-plate SP5, and the sixth sub-plate SP6, includes a double-layer structure. Optionally, the double-layer structure includes a first sub-layer in a same layer as the fifth connecting portion CP5 and the fourth connecting portion CP4, and a second sub-layer in a same layer as the respective one of the plurality of residual connecting bridge RCB.

Referring to FIG. 5C, the third sub-portion SP3 includes a double-layer structure, which includes a first sub-layer in a same layer as the fourth connecting portion CP4 and fifth connecting portion CP5, and a second sub-layer in a same layer as the respective one of the plurality of residual connecting bridge RCB. The second sub-layer of the third sub-portion SP3 is electrically connected to the first sub-layer of the third sub-portion SP3 through a third via v3 extending through the touch insulating layer TI.

Referring to FIG. 5C, the fourth sub-portion SP4 includes a double-layer structure, which includes a first sub-layer in a same layer as the fourth connecting portion CP4 and fifth connecting portion CP5, and a second sub-layer in a same layer as the respective one of the plurality of residual connecting bridge RCB. The second sub-layer of the fourth sub-portion SP4 is electrically connected to the first sub-layer of the fourth sub-portion SP4 through a fourth via v4 extending through the touch insulating layer TI.

Referring to FIG. 5D, the fifth sub-portion SP5 includes a double-layer structure, which includes a first sub-layer in a same layer as the fourth connecting portion CP4 and fifth connecting portion CP5, and a second sub-layer in a same layer as the respective one of the plurality of residual connecting bridge RCB. The second sub-layer of the fifth sub-portion SP5 is electrically connected to the first sub-layer of the fifth sub-portion SP5 through a fifth via v5 extending through the touch insulating layer TI.

Referring to FIG. 5D, the sixth sub-portion SP6 includes a double-layer structure, which includes a first sub-layer in a same layer as the fourth connecting portion CP4 and fifth connecting portion CP5, and a second sub-layer in a same layer as the respective one of the plurality of residual connecting bridge RCB. The second sub-layer of the sixth sub-portion SP6 is electrically connected to the first sub-layer of the sixth sub-portion SP6 through a sixth via v6 extending through the touch insulating layer TI.

Figure 6A:
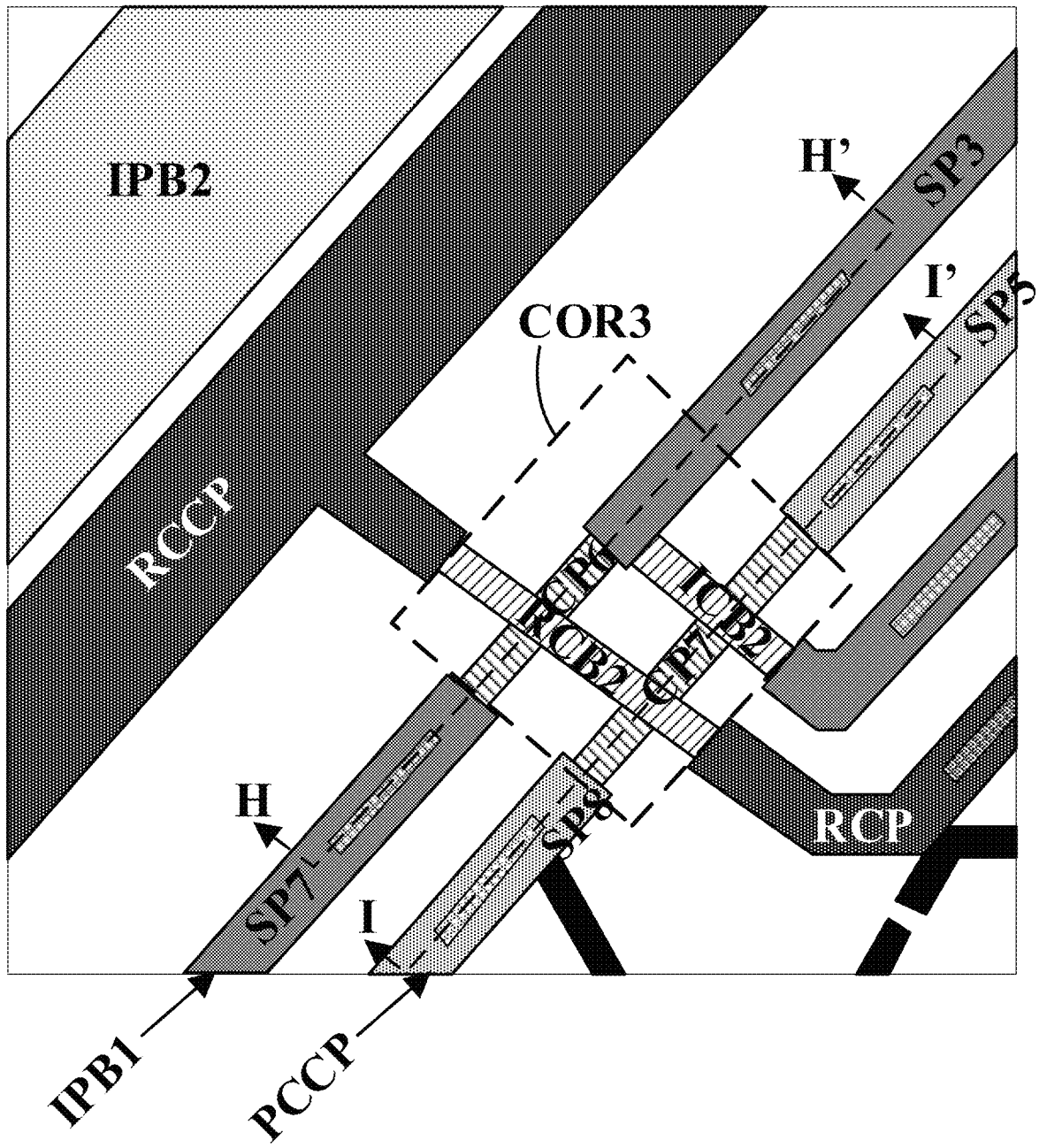
FIG. 6A is a zoom-in view of a third crossing-over region in FIG. 2.
Figure 6B:
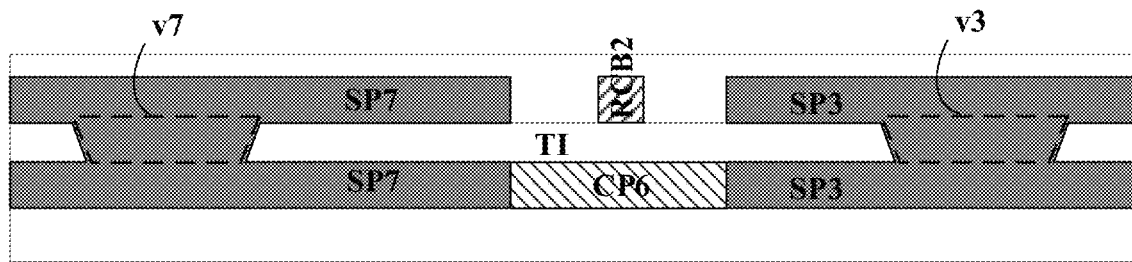
FIG. 6B shows a cross-sectional view along an H-H' line in FIG. 6A.
Figure 6C:
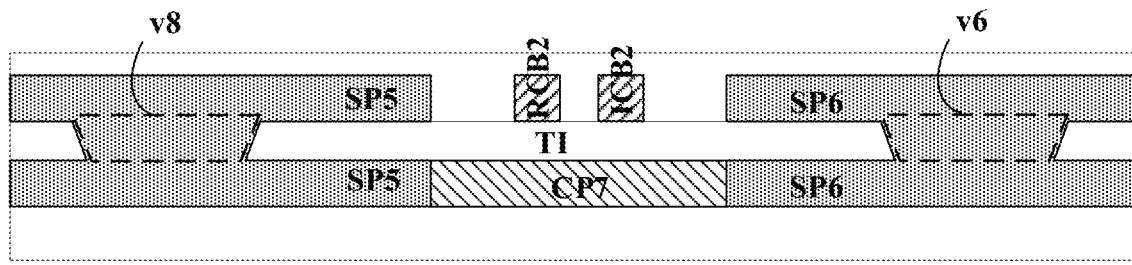
FIG. 6C shows a cross-sectional view along an I-I' line in FIG. 6A.

FIG. 6A is a zoom-in view of a third crossing-over region in FIG. 2. FIG. 6B shows a cross-sectional view along an H-H' line in FIG. 6A. FIG. 6C shows a cross-sectional view along an I-I' line in FIG. 6A. Referring to FIG. 1, FIG. 2, FIG. 3, and FIG. 6A to FIG. 6C, in a third crossing-over region COR3, the residual connecting conductive plate RCCP is connected to the respective one of the plurality of residual conductive plates RCP through a second respective one of the plurality of residual connecting bridge RCB2.

In some embodiments, the first interference preventing plate IPB1 includes a seventh sub-plate SP7, and a sixth connecting portion CP6 connecting the third sub-plate SP3 and the seventh sub-plate SP7. Optionally, the sixth connecting portion CP6 is in the third crossing-over region COR3. Optionally, the sixth connecting portion CP6 is insulated from the second respective one of the plurality of residual connecting bridges RCB2 by the touch insulating layer TI.

In some embodiments, the protrusion connecting conductive plate PCCP further includes an eighth sub-plate SP8 and a seventh connecting portion CP7 connecting the fifth sub-plate SP5 and the eighth sub-plate SP8. Optionally, the seventh connecting portion CP7 is in the third crossing-over region COR3. Optionally, the seventh connecting portion CP7 is insulated from the second respective one of the plurality of residual connecting bridges RCB2 by the touch insulating layer TI. Optionally, the fourth connecting portion CP4, the fifth connecting portion CP5, the sixth connecting portion CP6, and the seventh connecting portion CP7 are in a same layer.

In some embodiments, referring to FIG. 3, FIG. 5A to FIG. 5E, and FIG. 6A to FIG. 6C, the first interference preventing plate IPB1 further includes an inner sub-plate SPi between a respective one of the plurality of residual portions RP and the fifth sub-plate SP5; a first inner connecting bridge ICB1, and a second inner connecting bridge ICB2. The first inner connecting bridge ICB1 and the second inner connecting bridge ICB2 respectively connect the inner sub-plate SPi to the third sub-plate SP3. Optionally, the first inner connecting bridge ICB1, the second inner connecting bridge ICB2, the respective one of the plurality of residual connecting bridges RCB, the second respective one of the plurality of residual connecting bridges RCB2, are in a same layer.

Figure 7:
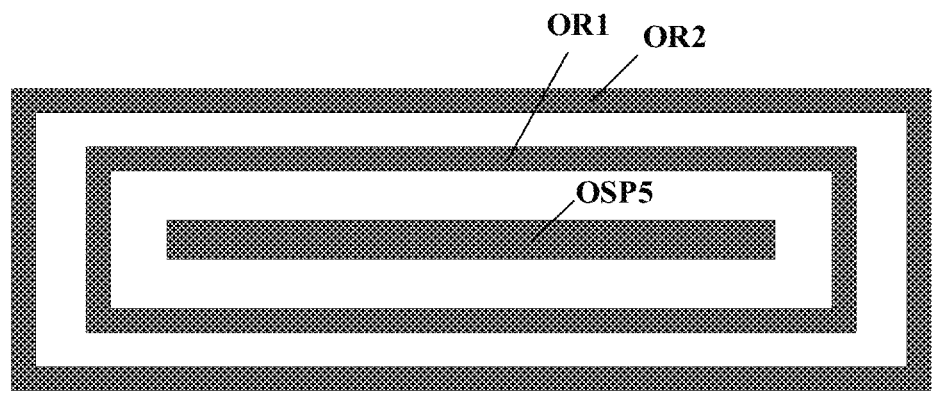
FIG. 7 illustrates orthographic projections of a first ring structure, a second ring structure, and a fifth sub-plate on a touch insulating layer in some embodiments according to the present disclosure.

In some embodiments, the inner sub-plate SPi, the third sub-plate SP3, the first inner connecting bridge ICB1, and the second inner connecting bridge ICB2, form a first ring structure. FIG. 7 illustrates orthographic projections of a first ring structure, a second ring structure, and a fifth sub-plate on a touch insulating layer in some embodiments according to the present disclosure. Referring to FIG. 7, optionally, an orthographic projection OR1 of the first ring structure on the touch insulating layer surround an orthographic projection OSP5 of the fifth sub-plate.

In some embodiments, the touch control structure includes a plurality of first ring structures. In one example, a respective one of the plurality of first ring structures is connected to a first adjacent first ring structure through the fourth connecting portion CP4 and the fourth sub-plate SP4. In another example, a respective one of the plurality of first ring structures is connected to a second adjacent first ring structure through the sixth connecting portion CP6 and the seventh sub-plate SP7.

In some embodiments, the respective one of the plurality of residual conductive plates RCP, the respective one of the plurality of residual connecting bridges RCB, the second respective one of the plurality of residual connecting bridges RCB2, and a portion of the residual connecting conductive plate RCCP form a second ring structure. Referring to FIG. 7, optionally, an orthographic projection OR2 of the second ring structure on the touch insulating layer surround an orthographic projection OR1 of the first ring structure on the touch insulating layer.

In some embodiments, the touch control structure includes a plurality of second ring structures. In one example, respective portions of the residual connecting conductive plate RCCP respectively form respective first sides of the plurality of second ring structures. In another example, the plurality of residual conductive plates RCP respectively form respective second sides of the plurality of second ring structures.

In some embodiments, each of the residual connecting conductive plate RCCP, the respective one of the plurality of residual conductive plates RCP, the inner sub-plate SPi, the third sub-plate SP3, the fourth sub-plate SP4, the fifth sub-plate SP5, the sixth sub-plate SP6, the seventh sub-plate SP7, and the eighth sub-plate SP8, includes a double-layer structure. Optionally, the double-layer structure includes a first sub-layer in a same layer as the fifth connecting portion CP5 and the fourth connecting portion CP4, and a second sub-layer in a same layer as the respective one of the plurality of residual connecting bridge RCB.

Referring to FIG. 6B, the seventh sub-portion SP7 includes a double-layer structure, which includes a first sub-layer in a same layer as the fourth connecting portion CP4 and fifth connecting portion CP5, and a second sub-layer in a same layer as the respective one of the plurality of residual connecting bridge RCB. The second sub-layer of the seventh sub-portion SP7 is electrically connected to the first sub-layer of the seventh sub-portion SP7 through a seventh via v7 extending through the touch insulating layer TI.

Referring to FIG. 6C, the eighth sub-portion SP8 includes a double-layer structure, which includes a first sub-layer in a same layer as the fourth connecting portion CP4 and fifth connecting portion CP5, and a second sub-layer in a same layer as the respective one of the plurality of residual connecting bridge RCB. The second sub-layer of the eighth sub-portion SP8 is electrically connected to the first sub-layer of the eighth sub-portion SP8 through a eighth via v8 extending through the touch insulating layer TI.

Referring to FIG. 2, in some embodiments, the plurality of residual portions RP includes a last residual portion RPL, and the plurality of residual conductive plates RCP includes a last residual conductive plate RCPL. Optionally, the last residual portion RPL is a residual portion among the plurality of residual portions RP most distal to the adjacent mesh block ARMB, and the last residual conductive plate RCPL among the plurality of residual conductive plates RCP most distal to the adjacent mesh block ARMB. The plurality of residual connecting bridges RCB includes a first last residual connecting bridge RCBL1 and a second last residual connecting bridge RCBL2 respectively connecting the last residual portion RPL to the last residual conductive plate RCPL. Optionally, a portion of the residual connecting conductive plate RCCP, the last residual conductive plate RCPL, the first last residual connecting bridge RCBL1, the second last residual connecting bridge RCBL2 form a third ring structure.

Figure 8:
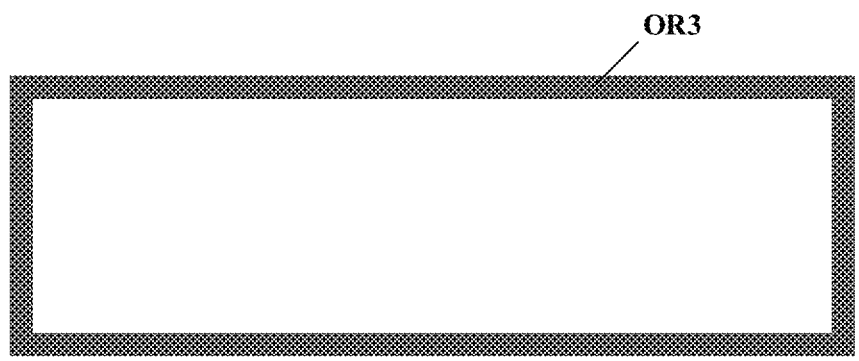
FIG. 8 illustrates an orthographic projection of a third ring structure in some embodiments according to the present disclosure.

FIG. 8 illustrates an orthographic projection of a third ring structure in some embodiments according to the present disclosure. Referring to FIG. 2 and FIG. 8, optionally, orthographic projections of the protrusion connecting conductive plate PCCP and interference preventing plates (IPB1 or IPB2) on a touch insulating layer are absent inside an orthographic projection of the third ring structure OR3 on the touch insulating layer.

In some embodiments, the first last residual connecting bridge RCBL1 or the second last residual connecting bridge RCBL2 or both include a single-layer structure, while the last residual conductive plate RCPL or the residual connecting conductive plate RCCP or both include a double-layer structure as described above. For example, as shown in FIG. 2, each of the first last residual connecting bridge RCBL1 and the second last residual connecting bridge RCBL2 includes a single-layer structure.

Figure 9:
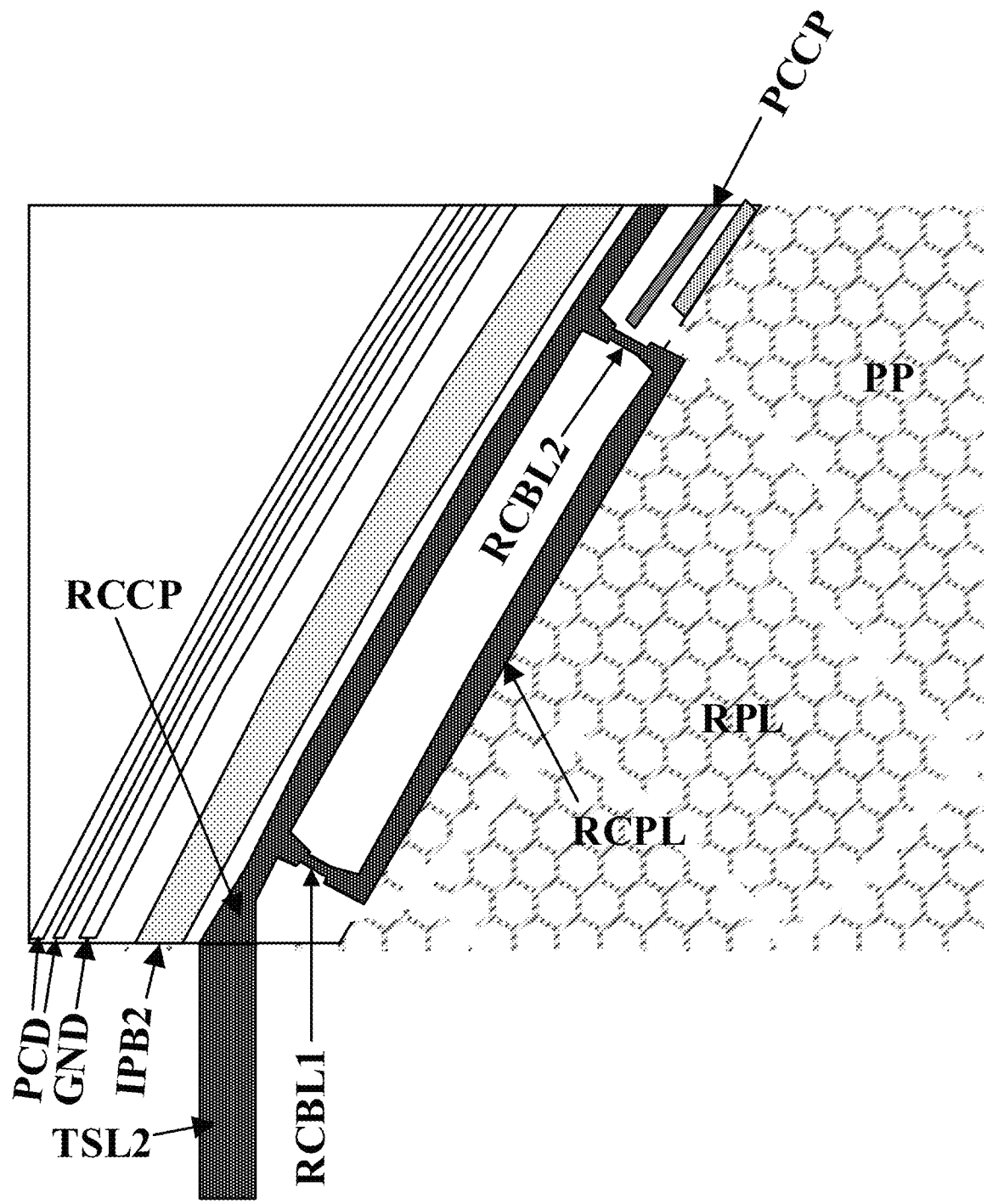
FIG. 9 illustrates the structure around a last residual portion RPL of a touch control structure in some embodiments according to the present disclosure.

FIG. 9 illustrates the structure around a last residual portion RPL of a touch control structure in some embodiments according to the present disclosure. Referring to FIG. 9, each of the first last residual connecting bridge RCBL1, the second last residual connecting bridge RCBL2, the last residual conductive plate RCPL, and the residual connecting conductive plate RCCP includes a double-layer structure.

In some embodiments, the touch control structure further includes a second touch signal line (one of the plurality of second touch signal lines). Referring to FIG. 9, in some embodiments, the residual connecting conductive plate RCCP is connected to a second touch signal line TSL2.

Referring to FIG. 2, FIG. 3, FIG. 5A, and FIG. 6A, in some embodiments, the touch control structure further includes a second interference preventing plate IPB2 extending along a periphery of the residual connecting conductive plate RCCP. Optionally, the residual connecting conductive plate RCCP is between the second interference preventing plate IPB2 and the protrusion connecting conductive plate PCCP. The second interference preventing plate IPB2 is configured to prevent or reduce the interference between the plurality of first mesh electrodes TE1 and the plurality of second mesh electrodes TE2 in the corner region. For example, the second interference preventing plate IPB2 is configured to prevent or reduce the interference between the residual connecting conductive plate RCCP and the protrusion connecting conductive plate PCCP. By having a second interference preventing plate IPB2, interference between touch scanning signals (e.g., Tx signals) and touch sensing signals (e.g., Rx signals) can be further significantly reduced. Optionally, the second interference preventing plate IPB2 is configured to be provided with a square wave scanning signal (e.g., similar to or same as a touch scanning signal provided to touch scanning electrodes of the touch control structure). Optionally, the second interference preventing plate IPB2 is configured to be provided with a constant voltage signal.

Referring to FIG. 2 and FIG. 3, the touch control structure in some embodiments further includes a ground signal line GND configured to be provided with a ground voltage. Optionally, the ground signal line GND extends along a periphery of the second interference preventing plate IPB2.

Referring to FIG. 2 and FIG. 4A, the touch control structure in some embodiments further includes a third interference preventing plate IPB3. Optionally, the third interference preventing plate IPB3 is between the first touch signal line TSL and the adjacent conductive plate ACP.

Referring to FIG. 2 and FIG. 3, the touch control structure in some embodiments further includes one or more probability of crack detection lines PCD, used for detecting crack in a panel having the touch control structure. Optionally, the one or more probability of crack detection lines PCD extend along a periphery of the ground signal line GND.

Optionally, mesh lines of the plurality of first mesh electrodes TE1 and the plurality of second mesh electrodes TE2 have an average line width in a range of 1 μm to 7 μm, e.g., 1 μm to 2 μm, 2 μm to 3 μm, 3 μm to 4 μm, 4 μm to 5 μm, 5 μm to 6 μm, or 6 μm to 7 μm. Optionally, the mesh lines have an average line width of 4 μm.

Optionally, the first interference preventing plate IPB1 has a minimum plate width in a range of 4 μm to 30 μm, e.g., 4 μm to 6 μm, 6 μm to 8 μm, 8 μm to 10 μm, 10 μm to 15 μm, 15 μm to 20 μm, 20 μm to 25 μm, or 25 μm to 30 μm. Optionally, the first interference preventing plate IPB1 has a minimum plate width of 10 μm. Optionally, the first interference preventing plate IPB1 has an average plate width in a range of 4 μm to 30 μm, e.g., 4 μm to 6 μm, 6 μm to 8 μm, 8 μm to 10 μm, 10 μm to 15 μm, 15 μm to 20 μm, 20 μm to 25 μm, or 25 μm to 30 μm. Optionally, the first interference preventing plate IPB1 has an average plate width of 10 μm.

Optionally, the second interference preventing plate IPB2 has a minimum plate width in a range of 10 μm to 100 μm, e.g., 10 μm to 20 μm, 20 μm to 30 μm, 30 μm to 40 μm, 40 μm to 50 μm, 50 μm to 60 μm, 60 μm to 70 μm, 70 μm to 80 μm, 80 μm to 90 μm, or 90 μm to 100 μm. Optionally, the second interference preventing plate IPB2 has a minimum plate width of 50 μm. Optionally, the second interference preventing plate IPB2 has an average plate width in a range of 4 μm to 30 μm, e.g., 10 μm to 100 μm, e.g., 10 μm to 20 μm, 20 μm to 30 μm, 30 μm to 40 μm, 40 μm to 50 μm, 50 μm to 60 μm, 60 μm to 70 μm, 70 μm to 80 μm, 80 μm to 90 μm, or 90 μm to 100 μm. Optionally, the second interference preventing plate IPB2 has an average plate width of 50 μm.

Optionally, the residual connecting conductive plate RCCP has a minimum plate width in a range of 10 μm to 60 μm, e.g., 10 μm to 20 μm, 20 μm to 30 μm, 30 μm to 40 μm, 40 μm to 50 μm, or 50 μm to 60 μm. Optionally, the residual connecting conductive plate RCCP has a minimum plate width of 50 μm. Optionally, the residual connecting conductive plate RCCP has an average plate width in a range of 10 μm to 60 μm, e.g., 10 μm to 20 μm, 20 μm to 30 μm, 30 μm to 40 μm, 40 μm to 50 μm, or 50 μm to 60 μm. Optionally, the residual connecting conductive plate RCCP has an average plate width of 28 μm.

Optionally, the protrusion connecting conductive plate PCCP has a minimum plate width in a range of 4 μm to 30 μm, e.g., 4 μm to 6 μm, 6 μm to 8 μm, 8 μm to 10 μm, 10 μm to 15 μm, 15 μm to 20 μm, 20 μm to 25 μm, or 25 μm to 30 μm.

Optionally, the protrusion connecting conductive plate PCCP has a minimum plate width of 10 μm. Optionally, the protrusion connecting conductive plate PCCP has an average plate width in a range of 4 μm to 30 μm, e.g., 4 μm to 6 μm, 6 μm to 8 μm, 8 μm to 10 μm, 10 μm to 15 μm, 15 μm to 20 μm, 20 μm to 25 μm, or 25 μm to 30 μm. Optionally, the protrusion connecting conductive plate PCCP has an average plate width of 10 μm.

Optionally, the plurality of residual conductive plates RCP have a minimum plate width in a range of 4 μm to 30 μm, e.g., 4 μm to 6 μm, 6 μm to 8 μm, 8 μm to 10 μm, 10 μm to 15 μm, 15 μm to 20 μm, 20 μm to 25 μm, or 25 μm to 30 m.

Optionally, the plurality of residual conductive plates RCP have a minimum plate width of 10 μm. Optionally, the plurality of residual conductive plates RCP have an average plate width in a range of 4 μm to 30 μm, e.g., 4 μm to 6 μm, 6 μm to 8 μm, 8 μm to 10 μm, 10 μm to 15 μm, 15 μm to 20 μm, 20 μm to 25 μm, or 25 μm to 30 μm. Optionally, the plurality of residual conductive plates RCP have an average plate width of 10 μm.

As used herein, the term "plate width" refers to a width of a plate along a direction substantially perpendicular to an extension direction of the plate and substantially parallel to a main surface of the touch control structure. In one example, the term "plate width" is a lateral cross-sectional width of the plate. Optionally, the plate width (referring to a plate width of any one of the first interference preventing plate IPB1, the second interference preventing plate IPB2, the residual connecting conductive plate RCCP, the protrusion connecting conductive plate PCCP, or the plurality of residual conductive plates RCP) is greater than an average line width of the mesh lines. Optionally, a ratio between the plate width and the line width is in a range 1:1 to 50:1, e.g., 1:1 to 2:1, 2:1 to 3:1, 3:1 to 4:1, 4:1 to 5:1, 5:1 to 10:1, 10:1 to 20:1, 20:1 to 30:1, 30:1 to 40:1, or 40:1 to 50:1.

In some embodiments, the plurality of first mesh electrodes TE1 and the plurality of second mesh electrodes TE2 are in a same layer as the second sub-layer of the double-layer structure described herein. The touch insulating layer TI is between the plurality of first mesh electrodes TE1 and the first sub-layer, and between the plurality of second mesh electrodes TE2 and the first sub-layer. In one example, the second connecting portion CP2, the third connecting portion CP3, the plurality of residual connecting bridges RCB, the first inner connecting bridge ICB1, the second inner connecting bridge ICB2, the plurality of first mesh electrodes TE1, and the plurality of second mesh electrodes TE2 are in a same layer.

In some embodiments, the first connecting portion CP1, the fourth connecting portion CP4, the fifth connecting portion CP5, the sixth connecting portion CP6, the seventh connecting portion CP7, are in a same layer as the first sub-layer of the double-layer structure described herein. The touch insulating layer TI is between the second sub-layer and each of the first connecting portion CP1, the fourth connecting portion CP4, the fifth connecting portion CP5, the sixth connecting portion CP6, the seventh connecting portion CP7.

In another aspect, the present disclosure provides a display panel including the touch control structure described herein or fabricated by a method described herein, a plurality of display elements, and a plurality of thin film transistors for driving the plurality of display elements. Optionally, the display elements includes a plurality of light emitting diodes, for example, in an organic light emitting diode display panel. Optionally, the display elements include a liquid crystal layer in a plurality of subpixels, for example, in a liquid crystal display panel.

Figure 10A:
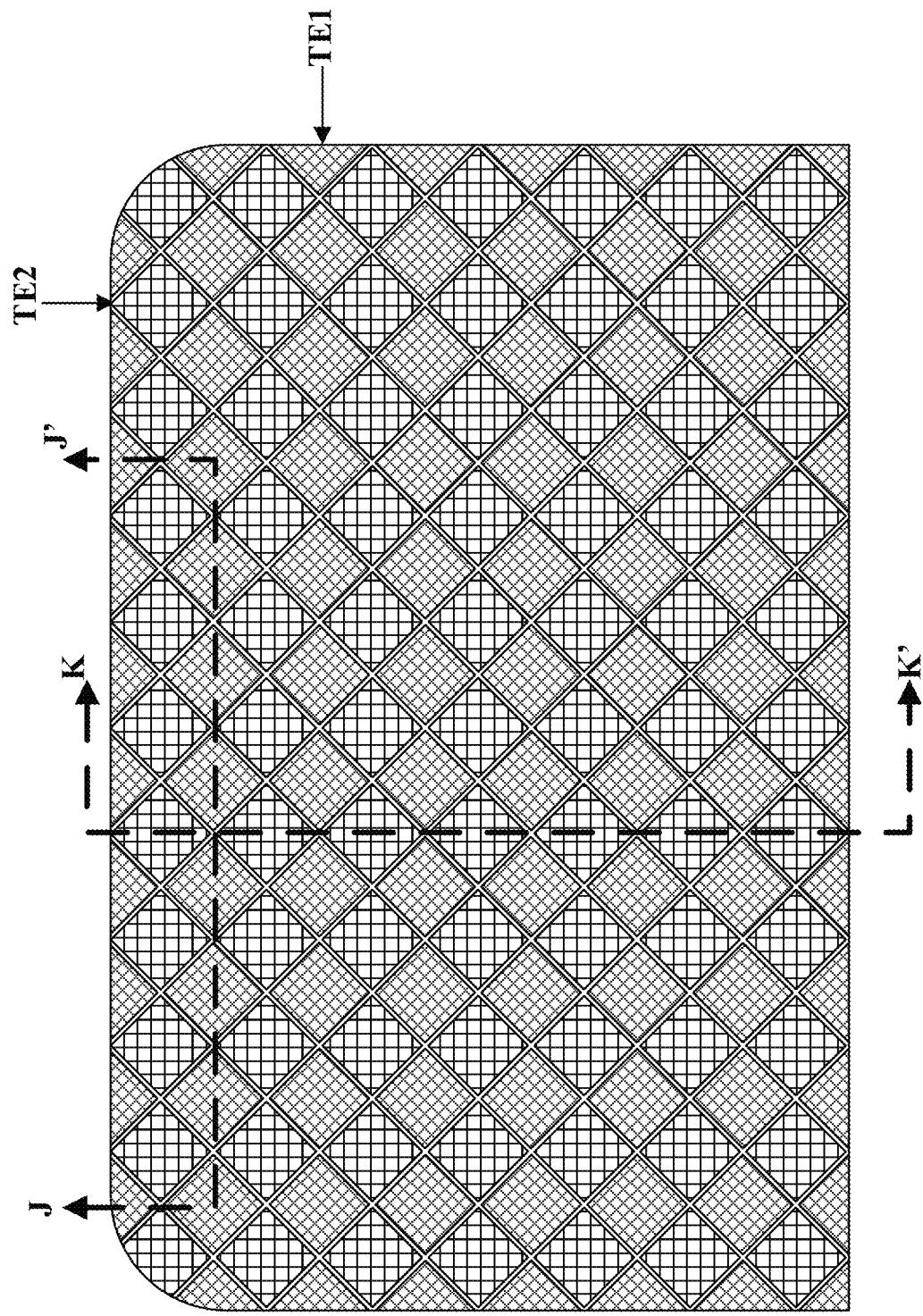
FIG. 10A is a plan view of a display panel in some embodiments according to the present disclosure.
Figure 10B:
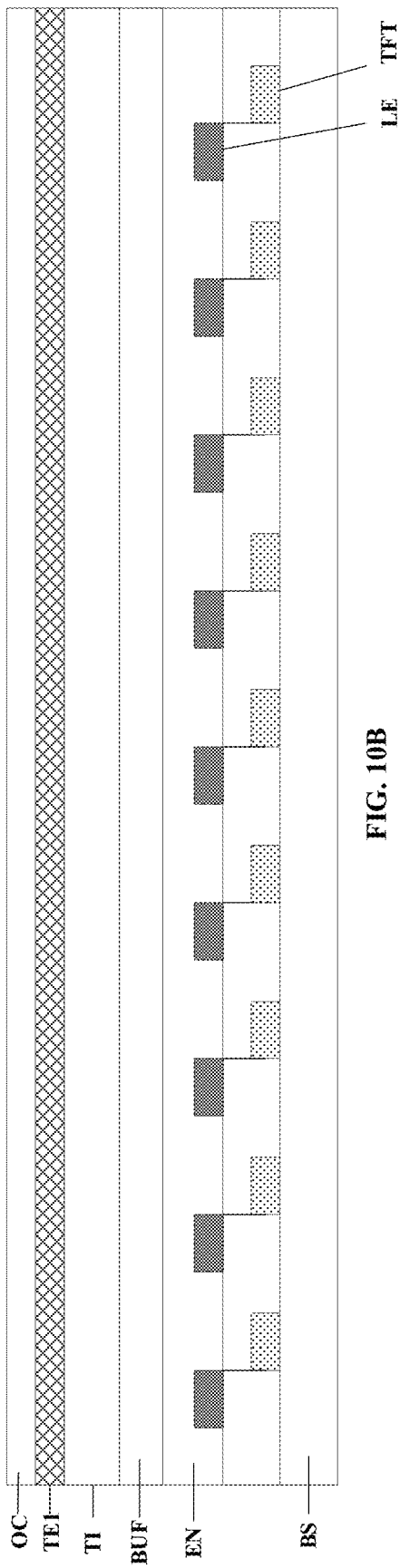
FIG. 10B is a cross-sectional view along a J-J' line in FIG. 10A.
Figure 10C:
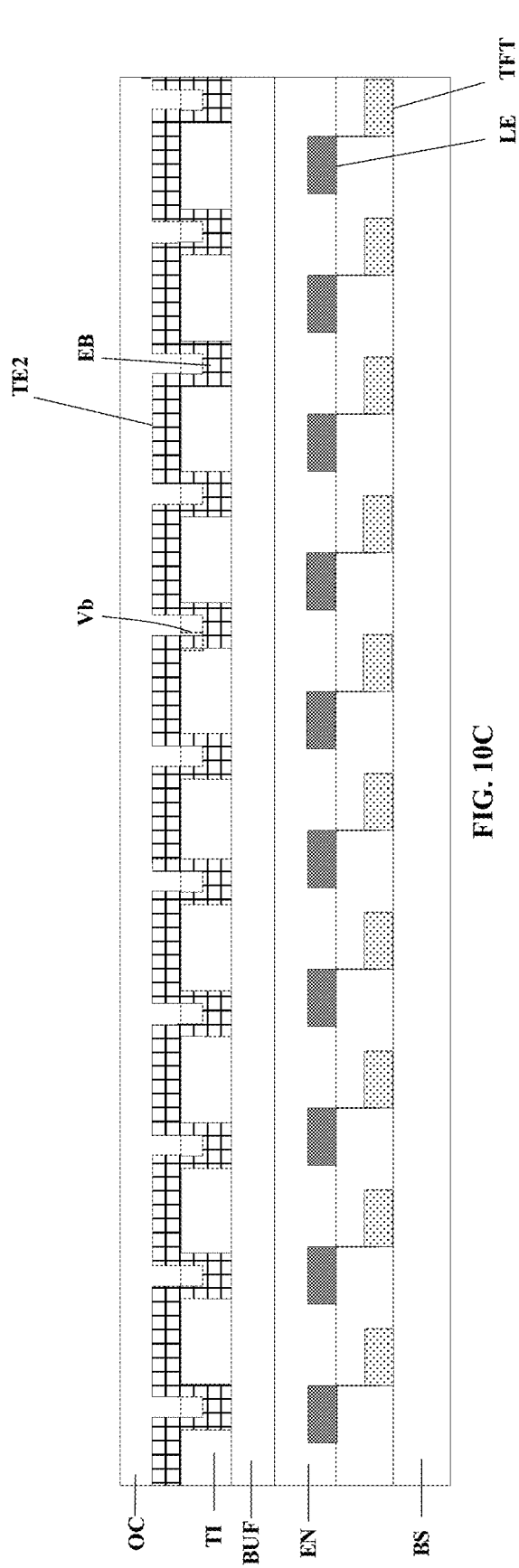
FIG. 10C is a cross-sectional view along a K-K' line in FIG. 10A.

FIG. 10A is a plan view of a display panel in some embodiments according to the present disclosure. FIG. 10B is a cross-sectional view along a J-J' line in FIG. 10A. FIG. 10C is a cross-sectional view along a K-K' line in FIG. 10A. In some embodiments, the display panel includes display elements and thin film transistors. Optionally, the display elements includes a plurality of light emitting diodes, for example, in an organic light emitting diode display panel.

Optionally, the display elements include a liquid crystal layer in a plurality of subpixels, for example, in a liquid crystal display panel. Referring to FIGS. 10B to 10C, in some embodiments, the display panel includes a base substrate BS, a plurality of thin film transistors TFT on the base substrate BS, and a plurality of light emitting elements LE on the base substrate BS and respectively connected to the plurality of thin film transistors TFT.

In some embodiments, the display panel further includes an encapsulating layer EN encapsulating the plurality of light emitting elements LE, a buffer layer BUF on a side of the encapsulating layer EN away from the base substrate BS, a touch insulating layer TI on a side of the buffer layer BUF away from the encapsulating layer EN. Optionally, the touch control structure further includes a plurality of touch electrode bridges EB. The touch insulating layer TI is between the plurality of touch electrode bridges EB, and the electrode blocks of the plurality of first touch electrodes TE1 and the plurality of second touch electrodes TE2. The plurality of touch electrode bridges EB respectively extend through vias Vb in the touch insulating layer TI to respectively connect adjacent second electrode blocks in a respective column of the plurality of column of the plurality of second touch electrodes TE2.

In some embodiments, the plurality of first mesh electrodes TE1 and the plurality of second mesh electrodes TE2 are in a same layer as the second sub-layer of the double-layer structure described herein. The touch insulating layer TI is between the plurality of first mesh electrodes TE1 and the first sub-layer, and between the plurality of second mesh electrodes TE2 and the first sub-layer. In one example, the second connecting portion CP2, the third connecting portion CP3, the plurality of residual connecting bridges RCB, the first inner connecting bridge ICB1, the second inner connecting bridge ICB2, the plurality of first mesh electrodes TE1, and the plurality of second mesh electrodes TE2 are in a same layer.

In some embodiments, the plurality of touch electrode bridges EB, the first connecting portion CP1, the fourth connecting portion CP4, the fifth connecting portion CP5, the sixth connecting portion CP6, the seventh connecting portion CP7, are in a same layer as the first sub-layer of the double-layer structure described herein. The touch insulating layer TI is between the second sub-layer and each of the first connecting portion CP1, the fourth connecting portion CP4, the fifth connecting portion CP5, the sixth connecting portion CP6, the seventh connecting portion CP7, the plurality of touch electrode bridges EB.

Figure 11:
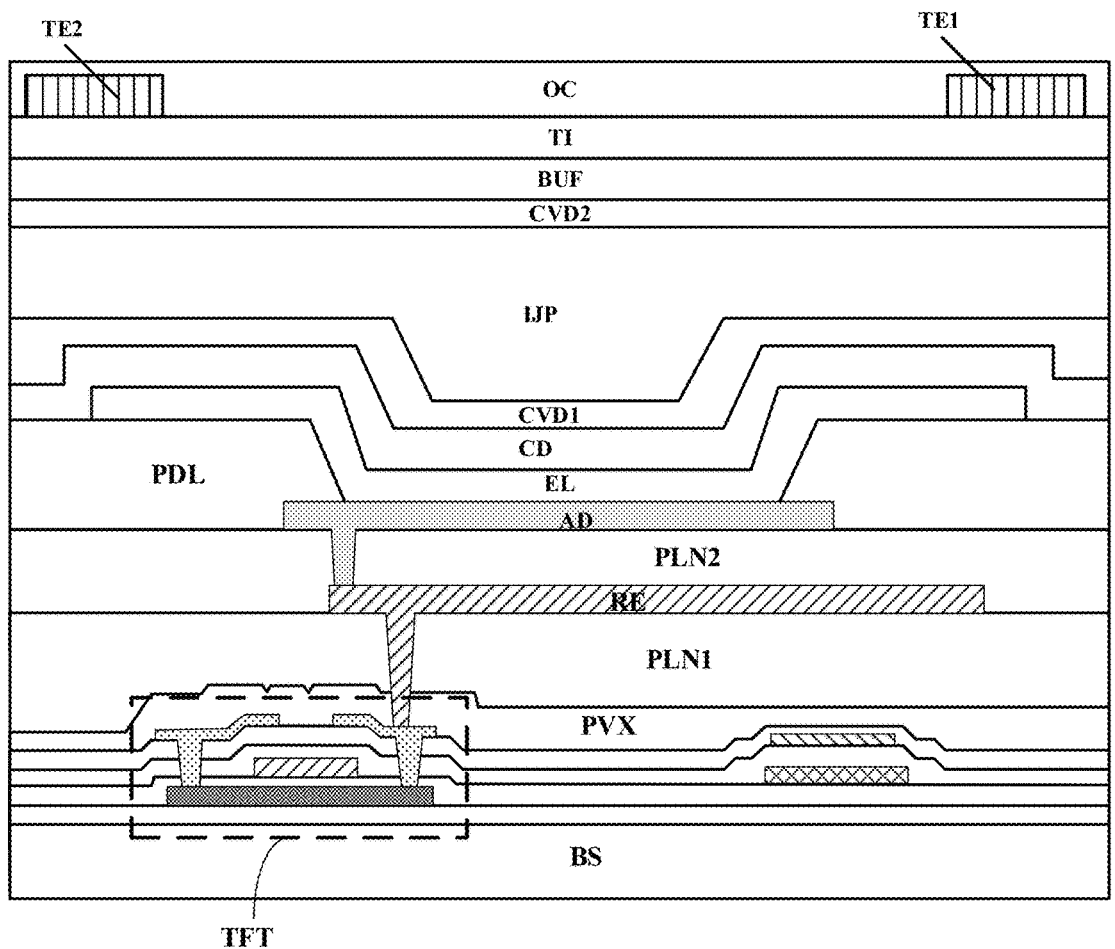
FIG. 11 is a cross sectional view of a display panel in some embodiments according to the present disclosure.

FIG. 11 is a cross sectional view of a display panel in some embodiments according to the present disclosure. Referring to FIG. 11, in the display region, the display panel includes a base substrate BS, a plurality of thin film transistors TFT on the base substrate BS, a passivation layer PVX on a side of the plurality of thin film transistors TFT away from the base substrate BS, a first planarization layer PLN1 on side of the passivation layer PVX away from the base substrate BS, a relay electrode RE on side of the first planarization layer PLN1 away from the passivation layer PVX, a second planarization layer PLN2 on a side of the relay electrode RE away from the first planarization layer PLN1, a pixel definition layer PDL on a side of the second planarization layer PLN2 away from the first planarization layer PLN1 and defining subpixel apertures, an anode AD on a side of the second planarization layer PLN2 away from the first planarization layer PLN1, a light emitting layer EL on a side of the anode AD away from the second planarization layer PLN2, a cathode CD on a side of the light emitting layer EL away from the anode AD, a first inorganic encapsulating layer CVD1 on a side of the cathode CD away from light emitting layer EL, an organic encapsulating layer IJP on a side of the first inorganic encapsulating layer CVD1 away from the cathode CD, a second inorganic encapsulating layer CVD2 on a side of the organic encapsulating layer IJP away from the first inorganic encapsulating layer CVD1, a buffer layer BUF on a side of the second inorganic encapsulating layer CVD2 away from the organic encapsulating layer IJP, a touch insulating layer TI on a side of the buffer layer BUF away from the second inorganic encapsulating layer CVD2, touch electrodes (e.g., the plurality of first touch electrodes TE1 and the plurality of second touch electrodes TE2 as shown in FIG. 23) on a side of the touch insulating layer TI away from the buffer layer BUF, and an overcoat layer OC on a side of the touch electrodes away from the touch insulating layer TI.

In another aspect, the present disclosure provides a display apparatus including a display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

Figure 12:
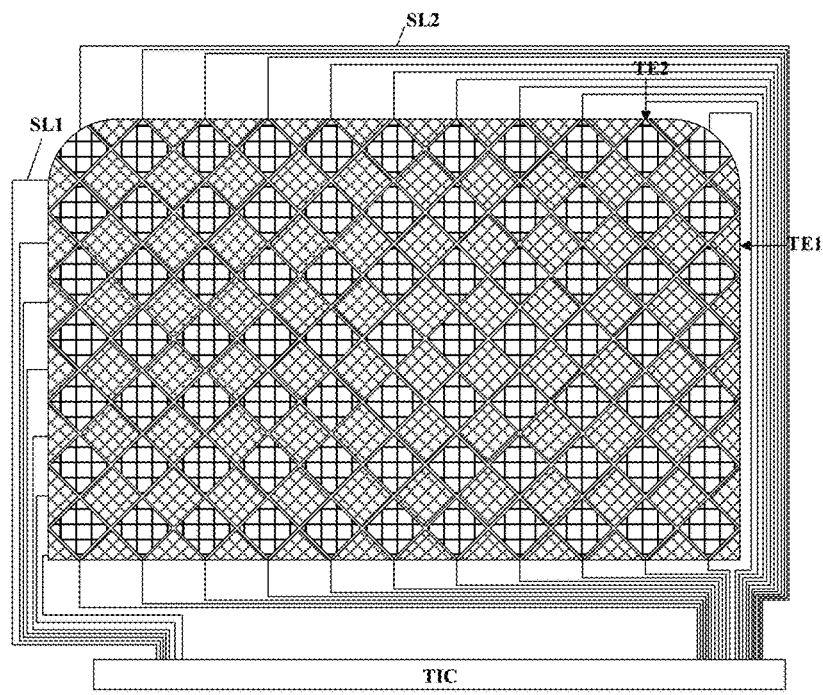
FIG. 12 is a schematic diagram illustrating the structure of a display apparatus having a touch control structure in some embodiments according to the present disclosure.

FIG. 12 is a schematic diagram illustrating the structure of a display apparatus having a touch control structure in some embodiments according to the present disclosure. In some embodiments, the touch control structure further includes a plurality of first touch signal lines SL1 respectively connected to the plurality of first mesh electrodes TE1, and a plurality of second touch signal lines SL2 respectively connected to the plurality of second mesh electrodes TE2. The display apparatus further includes a touch control driving integrated circuit TIC. The plurality of first touch signal lines SL1 and the plurality of second touch signal lines SL2 are connected to the touch control driving integrated circuit TIC.

In another aspect, the present disclosure provides a method of fabricating a touch control structure. In some embodiments, the method includes forming a plurality of first mesh electrodes arranged respectively in a plurality of rows and forming a plurality of second mesh electrodes arranged respectively in a plurality of columns. Optionally, forming the plurality of first mesh electrodes includes forming a corner row. Optionally, forming the corner row includes forming a plurality of row mesh blocks electrically connected along a row direction; and forming a plurality of residual portions in a corner region, and electrically connected to the plurality of row mesh blocks. Optionally, forming the plurality of second mesh electrodes includes forming a corner column. Optionally, forming the corner column includes forming a plurality of column mesh blocks electrically connected along a column direction; and forming a corner column mesh block at least partially in the corner region. Optionally, the corner column mesh block is formed to include a main portion and a plurality of protrusion portions along an edge of the main portion. Optionally, the plurality of residual portions and the plurality of protrusion portions are formed to be alternately arranged along a direction substantially parallel to the edge of the main portion. Optionally, the method further includes forming a residual connecting conductive plate electrically connecting the plurality of residual portions together. Optionally, the residual connecting conductive plate is formed to extend along a periphery of a combination of the plurality of protrusion portions and the plurality of residual portions.

In some embodiments, the method further includes forming a protrusion connecting conductive plate electrically connecting the plurality of protrusion portions together. Optionally, multiple mesh lines of a respective one of the plurality of protrusion portions are formed to be directly connected to the protrusion connecting conductive plate. Optionally, the protrusion connecting conductive plate is formed to extend along the periphery of the combination of the plurality of protrusion portions and the plurality of residual portions.

In some embodiments, the method further includes forming a plurality of residual conductive plates respectively connected to the plurality of residual portions. Optionally, multiple mesh lines of a respective one of the plurality of residual portions are formed to be directly connected to a respective one of the plurality of residual conductive plates. Optionally, the method further includes forming a plurality of residual connecting bridges respectively crossing over and insulated from the protrusion connecting conductive plate. Optionally, a respective one of the plurality of residual connecting bridges is formed to connect a respective one of the plurality of residual conductive plates to the residual connecting conductive plate. Optionally, in a region between the respective one of the plurality of residual conductive plates and the residual connecting conductive plate, a portion of the protrusion connecting conductive plate is formed between the respective one of the plurality of residual conductive plates and the residual connecting conductive plate.

In some embodiments, forming the plurality of row mesh blocks includes forming an adjacent mesh block. Optionally, the method further includes forming an adjacent conductive plate. Optionally, multiple mesh lines of the adjacent mesh block are formed to be directly connected to the adjacent conductive plate. Optionally, the residual connecting conductive plate is formed to be connected to the adjacent conductive plate.

In some embodiments, the method further includes forming a first touch signal line, a portion of which is formed on a side of the adjacent conductive plate away from the adjacent mesh block. Optionally, the first touch signal line is formed to extend along a periphery of a combination of the adjacent conductive plate and the adjacent mesh block. Optionally, the protrusion connecting conductive plate is formed to be connected to the first touch signal line.

In some embodiments, in a first crossing-over region, the residual connecting conductive plate is formed to be connected to the adjacent conductive plate, and the protrusion connecting conductive plate is formed to be connected to the first touch signal line. Optionally, the method further includes forming a first connecting portion and forming a second connecting portion respectively in the first crossing-over region, and forming a touch insulating layer, the touch insulating layer formed between the first connecting portion and the second connecting portion. Optionally, the first connecting portion is formed to connect the residual connecting conductive plate and the adjacent conductive plate together. Optionally, the second connecting portion is formed to connect the protrusion connecting conductive plate and the first touch signal line together.

In some embodiments, each of the residual connecting conductive plate, the adjacent conductive plate, at least a portion of the protrusion connecting conductive plate outside of crossing-over regions, and the first touch signal line, is formed as a double-layer structure. Optionally, the double-layer structure is formed to include a first sub-layer in a same layer as the first connecting portion and a second sub-layer in a same layer as the second connecting portion.

In some embodiments, the method further includes forming a first interference preventing plate. Optionally, forming the first interference preventing plate includes forming a first sub-plate, forming a second sub-plate, and forming a third connecting portion connecting the first sub-plate and the second sub-plate. Optionally, the third connecting portion is formed in the first crossing-over region and insulated from the first connecting portion by the touch insulating layer.

In some embodiments, the first interference preventing plate is configured to be provided with a square wave scanning signal. Optionally, the square wave scanning signal is same as a touch scanning signal provided to touch scanning electrodes of the touch control structure.

In some embodiments, each of the residual connecting conductive plate, the adjacent conductive plate, at least a portion of the protrusion connecting conductive plate outside of crossing-over regions, the first touch signal line, the first sub-plate, and the second sub-plate, is formed as a double-layer structure. Optionally, the double-layer structure is formed to include a first sub-layer in a same layer as the first connecting portion and a second sub-layer in a same layer as the second connecting portion.

In some embodiments, the method further includes forming vias respectively extending through the touch insulating layer. Optionally, the second sub-layer is formed to be electrically connected to the first sub-layer through a respective via extending through the touch insulating layer.

In some embodiments, in a second crossing-over region, the residual connecting conductive plate is formed to be connected to the respective one of the plurality of residual conductive plates through the respective one of the plurality of residual connecting bridge. Optionally, forming the first interference preventing plate further includes forming a third sub-plate, forming a fourth sub-plate, and forming a fourth connecting portion connecting the third sub-plate and the fourth sub-plate. Optionally, the fourth connecting portion is formed in the second crossing-over region and insulated from the respective one of the plurality of residual connecting bridges by the touch insulating layer.

In some embodiments, forming the protrusion connecting conductive plate includes forming a fifth sub-plate, forming a sixth sub-plate, and forming a fifth connecting portion connecting the fifth sub-plate and the sixth sub-plate. Optionally, the fifth connecting portion is formed in the second crossing-over region and insulated from the respective one of the plurality of residual connecting bridges by the touch insulating layer. Optionally, the fifth connecting portion and the fourth connecting portion are formed in a same layer.

In some embodiments, each of the residual connecting conductive plate, the respective one of the plurality of residual conductive plates, the third sub-plate, the fourth sub-plate, the fifth sub-plate, and the sixth sub-plate, is formed as a double-layer structure. Optionally, the double-layer structure is formed to include a first sub-layer in a same layer as the fifth connecting portion and the fourth connecting portion, and a second sub-layer in a same layer as the respective one of the plurality of residual connecting bridge.

In some embodiments, in a third crossing-over region, the residual connecting conductive plate is formed to be connected to the respective one of the plurality of residual conductive plates through a second respective one of the plurality of residual connecting bridge. Optionally, forming the first interference preventing plate further includes forming a seventh sub-plate, and forming a sixth connecting portion connecting the third sub-plate and the seventh sub-plate. Optionally, the sixth connecting portion is formed in the third crossing-over region and insulated from the second respective one of the plurality of residual connecting bridges by the touch insulating layer. Optionally, forming the protrusion connecting conductive plate further includes forming an eighth sub-plate and forming a seventh connecting portion connecting the fifth sub-plate and the eighth sub-plate. Optionally, the seventh connecting portion is formed in the third crossing-over region and insulated from the second respective one of the plurality of residual connecting bridges by the touch insulating layer. Optionally, the fourth connecting portion, the fifth connecting portion, the sixth connecting portion, and the seventh connecting portion are formed in a same layer.

In some embodiments, forming the first interference preventing plate further includes forming an inner sub-plate between a respective one of the plurality of residual portions and the fifth sub-plate; forming a first inner connecting bridge, and forming a second inner connecting bridge. Optionally, the first inner connecting bridge and the second inner connecting bridge are formed to respectively connect the inner sub-plate to the third sub-plate. Optionally, the inner sub-plate, the third sub-plate, the first inner connecting bridge, and the second inner connecting bridge, form a first ring structure. Optionally, an orthographic projection of the first ring structure on the touch insulating layer surround an orthographic projection of the fifth sub-plate. Optionally, the first inner connecting bridge, the second inner connecting bridge, the respective one of the plurality of residual connecting bridges, the second respective one of the plurality of residual connecting bridges, are formed in a same layer.

In some embodiments, the respective one of the plurality of residual conductive plates, the respective one of the plurality of residual connecting bridges, the second respective one of the plurality of residual connecting bridges, and a portion of the residual connecting conductive plate form a second ring structure. Optionally, an orthographic projection of the second ring structure on the touch insulating layer surround an orthographic projection of the first ring structure on the touch insulating layer.

In some embodiments, each of the residual connecting conductive plate, the respective one of the plurality of residual conductive plates, the inner sub-plate, the third sub-plate, the fourth sub-plate, the fifth sub-plate, the sixth sub-plate, the seventh sub-plate, and the eighth sub-plate, is formed as a double-layer structure. Optionally, the double-layer structure is formed to include a first sub-layer in a same layer as the fifth connecting portion and the fourth connecting portion, and a second sub-layer in a same layer as the respective one of the plurality of residual connecting bridge.

In some embodiments, the method further includes forming a plurality of residual conductive plates respectively connected to the plurality of residual portions. Optionally, multiple mesh lines of a respective one of the plurality of residual portions are formed to be directly connected to a respective one of the plurality of residual conductive plates. Optionally, a plurality of residual connecting bridges respectively are formed crossing over and insulated from the protrusion connecting conductive plate. Optionally, a respective one of the plurality of residual connecting bridge is formed to connect a respective one of the plurality of residual conductive plates to the residual connecting conductive plate. Optionally, forming the plurality of residual portions includes forming a last residual portion. Optionally, forming the plurality of residual conductive plates includes forming a last residual conductive plate. Optionally, forming the plurality of residual connecting bridges includes forming a first last residual connecting bridge and forming a second last residual connecting bridge, the first last residual connecting bridge and the second last residual connecting bridge formed respectively connecting the last residual portion to the last residual conductive plate. Optionally, a portion of the residual connecting conductive plate, the last residual conductive plate, the first last residual connecting bridge, the second last residual connecting bridge form a third ring structure. Optionally, orthographic projections of the protrusion connecting conductive plate and interference preventing plates on a touch insulating layer are absent inside an orthographic projection of the third ring structure on the touch insulating layer.

In some embodiments, the method further includes forming a second interference preventing plate extending along a periphery of the residual connecting conductive plate, the residual connecting conductive plate between the second interference preventing plate and the protrusion connecting conductive plate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch control structure, comprising a plurality of first mesh electrodes arranged respectively in a plurality of rows and a plurality of second mesh electrodes arranged respectively in a plurality of columns;
   wherein a corner row of the plurality of first mesh electrodes comprises:
   a plurality of row mesh blocks electrically connected along a row direction; and at least one residual portion in a corner region;
wherein a corner column of the plurality of second mesh electrodes comprises a plurality of column mesh blocks electrically connected along a column direction; and
a corner column mesh block at least partially in the corner region;
wherein the at least one residual portion is electrically connected to one of a row mesh block of the plurality of row mesh blocks or the corner column mesh block; and
the at least one residual portion is at least partially surrounded by, and spaced apart from, another of the row mesh block or the corner column mesh block.

2. The touch control structure of claim 1, wherein the corner column mesh block comprises a main portion and a plurality of protrusion portions along an edge of the main portion;
wherein a plurality of residual portions and the plurality of protrusion portions are alternately arranged along a direction substantially parallel to the edge of the main portion;
wherein the touch control structure further comprises a residual connecting conductive plate electrically connecting the plurality of residual portions together, the residual connecting conductive plate extending along a periphery of a combination of the plurality of protrusion portions and the plurality of residual portions.

3. The touch control structure of claim 2, further comprising a protrusion connecting conductive plate electrically connecting the plurality of protrusion portions together, multiple mesh lines of a respective one of the plurality of protrusion portions directly connected to the protrusion connecting conductive plate, the protrusion connecting conductive plate extending along the periphery of the combination of the plurality of protrusion portions and the plurality of residual portions.

4. The touch control structure of claim 3, further comprising a plurality of residual connecting bridges respectively crossing over and insulated from the protrusion connecting conductive plate.

5. The touch control structure of claim 4, further comprising a plurality of residual conductive plates respectively connected to the plurality of residual portions, multiple mesh lines of a respective one of the plurality of residual portions directly connected to a respective one of the plurality of residual conductive plates;
wherein a respective one of the plurality of residual connecting bridges connects a respective one of the plurality of residual conductive plates to the residual connecting conductive plate; and
in a region between the respective one of the plurality of residual conductive plates and the residual connecting conductive plate, a portion of the protrusion connecting conductive plate is between the respective one of the plurality of residual conductive plates and the residual connecting conductive plate.

6. The touch control structure of claim 5, wherein the plurality of row mesh blocks comprises an adjacent mesh block;
the touch control structure further comprises an adjacent conductive plate, multiple mesh lines of the adjacent mesh block directly connected to the adjacent conductive plate;
wherein the residual connecting conductive plate is connected to the adjacent conductive plate.

7. The touch control structure of claim 6, further comprising a first touch signal line, a portion of which on a side of the adjacent conductive plate away from the adjacent mesh block, the first touch signal line extending along a periphery of a combination of the adjacent conductive plate and the adjacent mesh block;
wherein the protrusion connecting conductive plate is connected to the first touch signal line.

8. The touch control structure of claim 7, wherein, in a first crossing-over region, the residual connecting conductive plate is connected to the adjacent conductive plate, and the protrusion connecting conductive plate is connected to the first touch signal line;
the touch control structure further comprises a first connecting portion and a second connecting portion respectively in the first crossing-over region, and a touch insulating layer between the first connecting portion and the second connecting portion;
the first connecting portion connects the residual connecting conductive plate and the adjacent conductive plate together; and
the second connecting portion connects the protrusion connecting conductive plate and the first touch signal line together.

9. The touch control structure of claim 8, wherein each of the residual connecting conductive plate, the adjacent conductive plate, at least a portion of the protrusion connecting conductive plate outside of crossing-over regions, and the first touch signal line, comprises a double-layer structure; and
the double-layer structure comprises a first sub-layer in a same layer as the first connecting portion and a second sub-layer in a same layer as the second connecting portion.

10. The touch control structure of claim 8, further comprising a first interference preventing plate, the first interference preventing plate comprising a first sub-plate, a second sub-plate, and a third connecting portion connecting the first sub-plate and the second sub-plate, the third connecting portion in the first crossing-over region and insulated from the first connecting portion by the touch insulating layer;
wherein the first sub-plate is between a portion of the residual connecting conductive plate and a portion of the protrusion connecting conductive plate; and
the second sub-plate is on a side of the first touch signal line away from the adjacent conductive plate.

11. The touch control structure of claim 10, wherein the first interference preventing plate is configured to be provided with a square wave scanning signal;
wherein the square wave scanning signal is same as a touch scanning signal provided to touch scanning electrodes of the touch control structure.

12. The touch control structure of claim 10, wherein each of the residual connecting conductive plate, the adjacent conductive plate, at least a portion of the protrusion connecting conductive plate outside of crossing-over regions, the first touch signal line, the first sub-plate, and the second sub-plate, comprises a double-layer structure; and
the double-layer structure comprises a first sub-layer in a same layer as the first connecting portion and a second sub-layer in a same layer as the second connecting portion.

13. The touch control structure of claim 9, further comprising vias extending through the touch insulating layer, the second sub-layer electrically connected to the first sub-layer through a respective via extending through the touch insulating layer.

14. The touch control structure of claim 4, wherein, in a second crossing-over region, the residual connecting conductive plate is connected to a respective one of the plurality of residual conductive plates through the respective one of the plurality of residual connecting bridge; and the touch control structure further comprises a first interference preventing plate, the first interference preventing plate comprising a third sub-plate, a fourth sub-plate, and a fourth connecting portion connecting the third sub-plate and the fourth sub-plate, the fourth connecting portion in the second crossing-over region and insulated from the respective one of the plurality of residual connecting bridges by the touch insulating layer;

the third sub-plate and the fourth sub-plate are between a portion of the residual connecting conductive plate and a portion of the protrusion connecting conductive plate.

15. The touch control structure of claim 14, wherein the protrusion connecting conductive plate comprises a fifth sub-plate, a sixth sub-plate, and a fifth connecting portion connecting the fifth sub-plate and the sixth sub-plate, the fifth connecting portion in the second crossing-over region and insulated from the respective one of the plurality of residual connecting bridges by the touch insulating layer, the fifth connecting portion and the fourth connecting portion in a same layer.

16. The touch control structure of claim 15, wherein, in a third crossing-over region, the residual connecting conductive plate is connected to the respective one of the plurality of residual conductive plates through a second respective one of the plurality of residual connecting bridge;

the first interference preventing plate further comprises a seventh sub-plate, and a sixth connecting portion connecting the third sub-plate and the seventh sub-plate, the sixth connecting portion in the third crossing-over region and insulated from the second respective one of the plurality of residual connecting bridges by the touch insulating layer; and the protrusion connecting conductive plate further comprises an eighth sub-plate and a seventh connecting portion connecting the fifth sub-plate and the eighth sub-plate, the seventh connecting portion in the third crossing-over region and insulated from the second respective one of the plurality of residual connecting bridges by the touch insulating layer, the fourth connecting portion, the fifth connecting portion, the sixth connecting portion, and the seventh connecting portion in a same layer.

17. The touch control structure of claim 16, wherein the first interference preventing plate further comprises an inner sub-plate between a respective one of the plurality of residual portions and the fifth sub-plate; a first inner connecting bridge, and a second inner connecting bridge, the first inner connecting bridge and the second inner connecting bridge respectively connecting the inner sub-plate to the third sub-plate; the inner sub-plate, the third sub-plate, the first inner connecting bridge, and the second inner connecting bridge, form a first ring structure;

an orthographic projection of the first ring structure on the touch insulating layer surround an orthographic projection of the fifth sub-plate; and the first inner connecting bridge, the second inner connecting bridge, the respective one of the plurality of residual connecting bridges, the second respective one of the plurality of residual connecting bridges, are in a same layer.

18. The touch control structure of claim 17, wherein the respective one of the plurality of residual conductive plates, the respective one of the plurality of residual connecting bridges, the second respective one of the plurality of residual connecting bridges, and a portion of the residual connecting conductive plate form a second ring structure; and an orthographic projection of the second ring structure on the touch insulating layer surround an orthographic projection of the first ring structure on the touch insulating layer.

19. The touch control structure of claim 2, further comprising a plurality of residual conductive plates respectively connected to the plurality of residual portions, multiple mesh lines of a respective one of the plurality of residual portions directly connected to a respective one of the plurality of residual conductive plates; and a plurality of residual connecting bridges respectively crossing over and insulated from the protrusion connecting conductive plate, a respective one of the plurality of residual connecting bridge connects a respective one of the plurality of residual conductive plates to the residual connecting conductive plate;

the plurality of residual portions comprises a last residual portion;

the plurality of residual conductive plates comprises a last residual conductive plate;

the plurality of residual connecting bridges comprises a first last residual connecting bridge and a second last residual connecting bridge respectively connecting the last residual portion to the last residual conductive plate;

a portion of the residual connecting conductive plate, the last residual conductive plate, the first last residual connecting bridge, the second last residual connecting bridge form a third ring structure; and orthographic projections of the protrusion connecting conductive plate and interference preventing plates on a touch insulating layer are absent inside an orthographic projection of the third ring structure on the touch insulating layer.

20. A display apparatus, comprising the touch control structure of claim 1, a display panel, and an integrated circuit connected to the display panel.

* * * * *